United States Patent
Fennimore et al.

(10) Patent No.: US 9,312,485 B2
(45) Date of Patent: Apr. 12, 2016

(54) PROCESS AND MATERIALS FOR MAKING CONTAINED LAYERS AND DEVICES MADE WITH SAME

(71) Applicant: E. I. DU PONT DE NEMOURS AND COMPANY, Wilmington, DE (US)

(72) Inventors: Adam Fennimore, Wilmington, DE (US); Denis Kondakov, Wilmington, DE (US); Steve Mackara, Townsend, DE (US); Frank Schadt, Wilmington, DE (US)

(73) Assignee: EI DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/652,304

(22) PCT Filed: Dec. 9, 2013

(86) PCT No.: PCT/US2013/073822
§ 371 (c)(1),
(2) Date: Jun. 15, 2015

(87) PCT Pub. No.: WO2014/093200
PCT Pub. Date: Jun. 19, 2014

(65) Prior Publication Data
US 2015/0318476 A1    Nov. 5, 2015

Related U.S. Application Data

(60) Provisional application No. 61/736,698, filed on Dec. 13, 2012.

(51) Int. Cl.
*H01L 51/00* (2006.01)
*H01L 51/56* (2006.01)

(52) U.S. Cl.
CPC ........ *H01L 51/0003* (2013.01); *H01L 51/0014* (2013.01); *H01L 51/56* (2013.01); *H01L 51/0034* (2013.01); *H01L 51/0039* (2013.01); *H01L 51/0043* (2013.01)

(58) Field of Classification Search
CPC ............ H01L 51/0002; H01L 51/0004; H01L 51/0012; H01L 51/52; H01L 51/56
USPC ........... 257/E21.04, E51.027, 40; 438/22, 99
See application file for complete search history.

(56) References Cited

U.S. PATENT DOCUMENTS 5,061,569 A * 10/1991 VanSlyke ............... C09K 11/06
                                                    252/301.16
5,728,801 A    3/1998 Wu et al.
(Continued)

FOREIGN PATENT DOCUMENTS

WO    03/008424 A1    1/2003
WO    03/040257 A1    5/2003
(Continued)

OTHER PUBLICATIONS

International Search Report, PCT/US2013/073822 filed Dec. 9, 2013.
(Continued)

*Primary Examiner* — Stephen W Smoot
*Assistant Examiner* — Edward Chin

(57) ABSTRACT

There is provided a process for forming a contained second layer over a first layer, including the steps:
  forming the first layer including a fluorinated material and a photoinitiator, and having a first surface energy;
  treating the first layer with a priming layer including an aromatic amine compound;
  exposing the priming layer patternwise with activating radiation, resulting in exposed areas and unexposed areas;
  developing the priming layer to effectively remove the priming layer from the unexposed areas resulting in a first layer having a patterned priming layer, wherein the patterned priming layer has a second surface energy that is higher than the first surface energy; and
  forming the second layer by liquid deposition on the patterned priming layer on the first layer.

7 Claims, 3 Drawing Sheets

(56) References Cited

U.S. PATENT DOCUMENTS

| | | | |
|---|---|---|---|
| 5,929,194 A * | 7/1999 | Woo | C08G 73/02 528/229 |
| 6,309,763 B1 | 10/2001 | Woo et al. | |
| 6,670,645 B2 | 12/2003 | Grushin et al. | |
| 7,250,461 B2 * | 7/2007 | Hsu | B82Y 30/00 524/445 |
| 7,402,701 B2 | 7/2008 | Kato et al. | |
| 7,772,360 B2 | 8/2010 | Kitano et al. | |
| 2003/0118866 A1 | 6/2003 | Oh et al. | |
| 2004/0094768 A1 | 5/2004 | Yu et al. | |
| 2004/0102577 A1 * | 5/2004 | Hsu | B82Y 10/00 525/182 |
| 2004/0127637 A1 * | 7/2004 | Hsu | B82Y 10/00 524/800 |
| 2004/0189190 A1 | 9/2004 | Suzuri et al. | |
| 2005/0184287 A1 | 8/2005 | Herron et al. | |
| 2005/0205860 A1 * | 9/2005 | Hsu | C08L 65/00 257/40 |
| 2005/0209422 A1 | 9/2005 | O'Dell et al. | |
| 2007/0298530 A1 * | 12/2007 | Feehery | H01L 51/0003 438/46 |
| 2008/0286487 A1 | 11/2008 | Lang et al. | |
| 2010/0213454 A1 * | 8/2010 | Lang | G03F 7/0046 257/40 |
| 2011/0017980 A1 * | 1/2011 | Fennimore | H01L 51/0004 257/40 |

FOREIGN PATENT DOCUMENTS

| | | |
|---|---|---|
| WO | 03/063555 A1 | 7/2003 |
| WO | 03/091688 A2 | 11/2003 |
| WO | 03/091688 A3 | 11/2003 |
| WO | 2004/016710 A1 | 2/2004 |
| WO | 2005/052027 A1 | 6/2005 |
| WO | 2008/024378 A2 | 2/2008 |
| WO | 2008/024379 A2 | 2/2008 |
| WO | 2008/150940 A1 | 12/2008 |
| WO | 2009/018009 A1 | 2/2009 |
| WO | 2009/067419 A1 | 5/2009 |
| WO | 2010/035364 A1 | 4/2010 |
| WO | 2010-099534 A2 | 9/2010 |
| WO | 2012-109609 A2 | 8/2012 |

OTHER PUBLICATIONS

Y. Wang, Kirk-Othmer Encyclopedia of Chemical Technology, 4$^{th}$ Edition, vol. 18, p. 837-860.

David Braun; Alan J. Heeger, "Visible Light Emission From Semiconducting Polymer Diodes", Applied Phys. Letters, 58, BI, 17M OO, 187201874 (May 6, 1991).

CRC Handbook of Chemistry & Physics, 81$^{st}$ Edition, (2000-2001)—Book Not Included.

Bruce Monroe; Gregory Weed, "Photoinitiators for Free-Radical-Initiated Photoimaging Systems", Chemical Reviews, 1993, vol. 93, No. 1, pp. 435-448 (Not Included).

Jean M.J. Frechet, "The Photogeneration of Acid and Base Within Polymer Coatings Approaches to Polymer Curing and Imaging" Pure and Applied Chemistry, vol. 64, No. 9, pp. 1239-1248, 1992.

Masamitsu S Hirai, Masahiro Tsunooka, "Photoacid and Photobase Generators: Chemistry and Applications to Polymeric Materials", Prog. Polymer Science, vol. 21, 1996, pp. 1-45.

Mukundan Thelakkat, "Star-Shaped, Dendrimeric and Polymeric Triarylamines As Photoconductors and Hole Transport Materials for Electro-Optical Applications", Macromolecular Materials Engineering, 2002, vol. 287, pp. 442-461.

\* cited by examiner

PROCESS AND MATERIALS FOR MAKING CONTAINED LAYERS AND DEVICES MADE WITH SAME

RELATED APPLICATION DATA

This application claims priority under 35 U.S.C. §119(e) from U.S. Provisional Application No. 61/736,698, filed on Dec. 13, 2012, which is incorporated by reference herein in its entirety.

BACKGROUND INFORMATION

1. Field of the Disclosure

This disclosure relates in general to a process for making an electronic device. It further relates to the device made by the process.

2. Description of the Related Art

Electronic devices utilizing organic active materials are present in many different kinds of electronic equipment. In such devices, an organic active layer is sandwiched between two electrodes.

One type of electronic device is an organic light emitting diode (OLED). OLEDs are promising for display applications due to their high power-conversion efficiency and low processing costs. Such displays are especially promising for battery-powered, portable electronic devices, including cellphones, personal digital assistants, handheld personal computers, and DVD players. These applications call for displays with high information content, full color, and fast video rate response time in addition to low power consumption.

Current research in the production of full-color OLEDs is directed toward the development of cost effective, high throughput processes for producing color pixels. For the manufacture of monochromatic displays by liquid processing, spin-coating processes have been widely adopted (see, e.g., David Braun and Alan J. Heeger, Appl. Phys. Letters 58, 1982 (1991)). However, manufacture of full-color displays requires certain modifications to procedures used in manufacture of monochromatic displays. For example, to make a display with full-color images, each display pixel is divided into three subpixels, each emitting one of the three primary display colors, red, green, and blue. This division of full-color pixels into three subpixels has resulted in a need to modify current processes to prevent the spreading of the liquid colored materials (i.e., inks) and color mixing.

Several methods for providing ink containment are described in the literature. These are based on containment structures, surface tension discontinuities, and combinations of both. Containment structures are geometric obstacles to spreading: pixel wells, banks, etc. In order to be effective these structures must be large, comparable to the wet thickness of the deposited materials. When the emissive ink is printed into these structures it wets onto the structure surface, so thickness uniformity is reduced near the structure. Therefore the structure must be moved outside the emissive "pixel" region so the non-uniformities are not visible in operation. Due to limited space on the display (especially high-resolution displays) this reduces the available emissive area of the pixel. Practical containment structures generally have a negative impact on quality when depositing continuous layers of the charge injection and transport layers. Consequently, all the layers must be printed.

In addition, surface tension discontinuities are obtained when there are either printed or vapor deposited regions of low surface tension materials. These low surface tension materials generally must be applied before printing or coating the first organic active layer in the pixel area. Generally the use of these treatments impacts the quality when coating continuous non-emissive layers, so all the layers must be printed.

An example of a combination of two ink containment techniques is $CF_4$-plasma treatment of photoresist bank structures (pixel wells, channels). Generally, all of the active layers must be printed in the pixel areas.

All these containment methods have the drawback of precluding continuous coating. Continuous coating of one or more layers is desirable as it can result in higher yields and lower equipment cost. There exists, therefore, a need for improved processes for forming electronic devices.

SUMMARY

There is provided a process for forming a contained second layer over a first layer, said process comprising:
- forming the first layer comprising a fluorinated material and a photoinitiator, said first layer having a first surface energy;
- treating the first layer with a priming layer consisting essentially of an aromatic amine compound;
- exposing the priming layer patternwise with activating radiation, resulting in exposed areas and unexposed areas;
- developing the priming layer to effectively remove the priming layer from the unexposed areas resulting in a first layer having a patterned priming layer thereon, wherein the patterned priming layer has a second surface energy that is higher than the first surface energy; and
- forming the second layer by liquid deposition on the patterned priming layer on the first layer.

There is further provided a process for forming a contained second layer over a first layer, said process comprising:
- forming the first layer comprising a fluorinated material, said first layer having a first surface energy;
- forming an intermediate layer on the first layer, said intermediate layer comprising a photoinitiator;
- forming a priming layer consisting essentially of an aromatic amine compound on the intermediate layer;
- exposing the priming layer patternwise with activating radiation, resulting in exposed areas and unexposed areas;
- developing the priming layer to effectively remove the priming layer and the intermediate layer from the unexposed areas, resulting in a first layer having thereon a patterned priming layer, wherein the patterned priming layer has a second surface energy that is higher than the first surface energy; and
- forming the second layer by liquid deposition on the patterned priming layer on the first layer.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
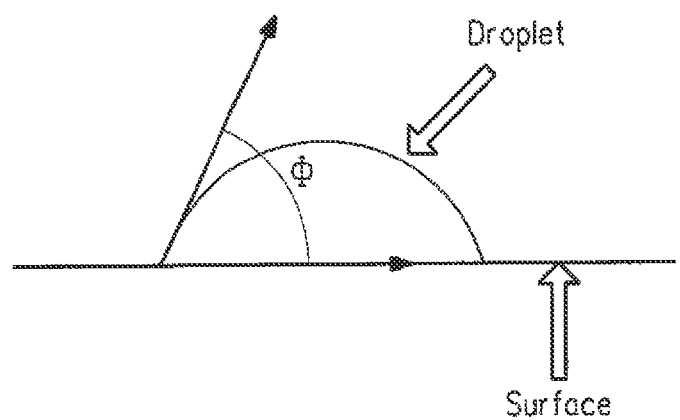
FIG. 1 includes a diagram illustrating contact angle.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

There is provided Process I for forming a contained second layer over a first layer, wherein Process I comprises:
 forming the first layer comprising a fluorinated material and a photoinitiator, said first layer having a first surface energy;
 treating the first layer with a priming layer consisting essentially of an aromatic amine compound;
 exposing the priming layer patternwise with activating radiation, resulting in exposed areas and unexposed areas;
 developing the priming layer to effectively remove the priming layer from the unexposed areas resulting in a first layer having a patterned priming layer thereon, wherein the patterned priming layer has a second surface energy that is higher than the first surface energy; and
 forming the second layer by liquid deposition on the patterned priming layer on the first layer.

There is also provided Process II for forming a contained second layer over a first layer, wherein Process II comprises:
 forming the first layer comprising a fluorinated, said first layer having a first surface energy;
 forming an intermediate layer on the first layer, said intermediate layer comprising a photoinitiator;
 forming a priming layer consisting essentially of an aromatic amine compound on the intermediate layer;
 exposing the priming layer patternwise with activating radiation, resulting in exposed areas and unexposed areas;
 developing the priming layer to effectively remove the priming layer and the intermediate layer from the unexposed areas, resulting in a first layer having thereon a patterned priming layer, wherein the patterned priming layer has a second surface energy that is higher than the first surface energy; and
 forming the second layer by liquid deposition on the patterned priming layer on the first layer.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by Process I, Process II, the Organic Electronic Device, and finally Examples.

1. Definitions and Clarification of Terms

Before addressing details of embodiments described below, some terms are defined or clarified.

The term "active" when referring to a layer or material, is intended to mean a layer or material that exhibits electronic or electro-radiative properties. In an electronic device, an active material electronically facilitates the operation of the device. Examples of active materials include, but are not limited to, materials which conduct, inject, transport, or block a charge, where the charge can be either an electron or a hole, and materials which emit radiation or exhibit a change in concentration of electron-hole pairs when receiving radiation. Examples of inactive materials include, but are not limited to, planarization materials, insulating materials, and environmental barrier materials.

The term "aromatic" as it refers to a compound or group, is intended to mean an organic compound or group comprising at least one unsaturated cyclic group having delocalized pi electrons. The aromatic cyclic group has 4n+2 pi electrons and is essentially planar. The term is intended to encompass both aromatic compounds and groups having only carbon and hydrogen atoms, and heteroaromatic compounds and groups wherein one or more of the carbon atoms within the cyclic group has been replaced by another atom, such as nitrogen, oxygen, sulfur, or the like.

The term "aromatic amine compound" is intended to mean a compound having at least one amino nitrogen directly bonded to at least one aromatic group. The term "amino nitrogen" is intended to mean a nitrogen atom with a lone pair of electrons. The aromatic amine compound includes at least one amino group which can be represented as $NR_3$, where R is H, D, alkyl or aryl and at least one R is aryl.

The term "aryl" is intended to mean a group derived from an aromatic compound. The term in intended to include "arylene" groups having more than one point of attachment. Similarly, the term "phenyl" is intended to encompass "phenylene", "naphthyl" is intended to encompass "naphthylene", and so forth.

The term "contained" when referring to a layer, is intended to mean that as the layer is printed, it does not spread significantly beyond the area where it is deposited despite a natural tendency to do so were it not contained. With "chemical containment" the layer is contained by surface energy effects. With "physical containment" the layer is contained by physical barrier structures. A layer may be contained by a combination of chemical containment and physical containment.

The terms "developing" and "development" refer to physical differentiation between areas of a material exposed to radiation and areas not exposed to radiation, and the removal of either the exposed or unexposed areas.

The term "electrode" is intended to mean a member or structure configured to transport carriers within an electronic component. For example, an electrode may be an anode, a cathode, a capacitor electrode, a gate electrode, etc. An electrode may include a part of a transistor, a capacitor, a resistor, an inductor, a diode, an electronic component, a power supply, or any combination thereof.

The term "fluorinated" when referring to an organic compound, is intended to mean that one or more of the hydrogen atoms bound to carbon in the compound have been replaced by fluorine. The term encompasses partially and fully fluorinated materials.

The term "hole transport" when referring to a layer, material, member, or structure, is intended to mean such layer, material, member, or structure that facilitates migration of positive charges through the thickness of such layer, material, member, or structure with relative efficiency and small loss of charge.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. A layer may be highly patterned or may be overall and unpatterned.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "liquid medium" is intended to mean a liquid material, including a pure liquid, a combination of liquids, a solution, a dispersion, a suspension, and an emulsion. Liquid medium is used regardless whether one or more solvents are present.

The term "organic electronic device" is intended to mean a device including one or more organic semiconductor layers or materials. An organic electronic device includes, but is not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

The term "photoactive" refers to a material or layer that emits light when activated by an applied voltage (such as in a light emitting diode or chemical cell) or responds to radiant energy and generates a signal with or without an applied bias voltage (such as in a photodetector or a photovoltaic cell).

The term "photoinitiator" is intended to mean a compound or combination of compounds which, when exposed to activating radiation, generates a reactive species. The term "activating radiation" refers to radiation having a wavelength to which the photoinitiator is sensitive and at which the photoinitiator generates the reactive species.

The term "polymerizable group or crosslinking group" refers to groups, or combinations of groups, which react to form chains or networks of linked repeating units. The term "conventional polymerizable or crosslinkable group" refers to a group, or combination of groups, which is typically known to undergo such reactions. Examples of types of conventional polymerizable or crosslinkable groups include olefinic groups, acrylates, methacrylates, vinyl ethers, siloxanes, cyclic ethers, cycloalkenes, acetylenic groups, cyanate groups, 1-benzo-3,4-cyclobutane, and the like.

The terms "radiating" and "radiation" refer to adding energy in any form, including heat in any form, the entire electromagnetic spectrum, or subatomic particles, regardless of whether such radiation is in the form of rays, waves, or particles.

The term "surface energy" is the energy required to create a unit area of a surface from a material. A characteristic of surface energy is that liquid materials with a given surface energy will not wet surfaces with a sufficiently lower surface energy. A layer with a low surface energy is more difficult to wet than a layer with a higher surface energy.

As used herein, the term "over" does not necessarily mean that a layer, member, or structure is immediately next to or in contact with another layer, member, or structure. There may be additional, intervening layers, members or structures.

As used herein, the terms "comprises," "comprising," "includes," "including," "has," "having," "contains," "containing," or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

Similarly, where an embodiment of the subject matter hereof is stated or described as being composed of or being constituted by or of certain features or elements, one or more features or elements in addition to those explicitly stated or described may be present in the embodiment.

An alternative embodiment of the disclosed subject matter hereof, is described as consisting essentially of certain features or elements, in which embodiment features or elements that would materially alter the principle of operation or the distinguishing characteristics of the embodiment are not present therein.

A further alternative embodiment of the described subject matter hereof is described as consisting of certain features or elements, in which embodiment, or in insubstantial variations thereof, only the features or elements specifically stated or described are present.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, $81^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Process I

Process I comprises:
  forming a first layer comprising a fluorinated material and a photoinitiator, said first layer having a first surface energy;
  treating the first layer with a priming layer consisting essentially of an aromatic amine compound, where components that would materially alter the principle of operation or the distinguishing characteristics of the priming layer are not present;
  exposing the priming layer patternwise with activating radiation, resulting in exposed areas and unexposed areas;
  developing the priming layer to effectively remove the priming layer from the unexposed areas resulting in a first layer having a patterned priming layer thereon, wherein the patterned priming layer has a second surface energy that is higher than the first surface energy; and forming the second layer by liquid deposition on the patterned priming layer on the first layer.

In some embodiments of the above process, there is no material in the first layer having conventional polymerizable or crosslinkable groups. The first layer comprises a fluorinated material and a photoinitiator, wherein no conventional polymerizable or crosslinkable groups are present.

In some embodiments of the above process, there is no material in the priming layer having conventional polymerizable or crosslinkable groups. The priming layer consists essentially of an aromatic amine compound, wherein no conventional polymerizable or crosslinkable groups are present and wherein other components that would materially alter the principle of operation or the distinguishing characteristics of the priming layer are not present.

In some embodiments of the above process, there is no material in the first layer or the priming layer having conventional polymerizable or crosslinkable groups. It has been found that polymerization or crosslinking reactions do not completely eliminate the presence of such groups and these remaining groups can have a deleterious effect on the performance of electronic devices. Surprisingly and unexpectedly, in the above process, the priming layer can be exposed and developed to form a pattern of exposed material, in the absence of conventional polymerizable or crosslinkable groups. When exposed to radiation, the material in the priming layer reacts to become less removable from the underlying first layer, relative to the unexposed priming layer. This change is enough to allow physical differentiation of the exposed and non-exposed areas and development.

a. Fluorinated Material

The composition of the fluorinated material is not particularly limited, so long as the surface energy of the first layer is lower than that of the priming layer.

In some embodiments, the fluorinated material is selected from the group consisting of partially- and fully-fluorinated hydrocarbons, fluorocarbon derivatives, fluoroaromatic compounds, fluoropolymers, and fluorinated acids.

In some embodiments, the fluorinated material is a $CF_4$ plasma-treated material. In some embodiments, the $CF_4$ plasma-treated material is organic.

In some embodiments, the fluorinated material is a fluorinated acid polymer.

In some embodiments, the fluorinated material is a conductive polymer doped with a fluorinated acid polymer.

In some embodiments, the fluorinated material has no conventional polymerizable or crosslinkable groups.

b. Photoinitiator

The photoinitiator is a compound or combination of compounds that generates a reactive species when exposed to activating radiation. Examples of reactive species include, but are not limited to free radicals, acids, and bases. As used herein, the terms "acid" and "base" encompass both Bronsted acids and bases and Lewis acids and bases.

Photoinitiators which generate free radicals are well known and have been extensively reviewed, as, for example, in Chem. Rev. 1993, 93(1), pp. 435-448. Exemplary types of such photoinitiators include, but are not limited to: halogen compounds, such as alpha-haloacetophenones; azo compounds; aromatic carbonyl compounds, such as benzoin ethers, ketals, acetophenones, o-acylated oximinoketones, and acylphosphine oxides; hexaarylbisimidazololes; peroxides and peroxyesters; ketones and quinones; thioxanthones; ketocoumarins; and 9-phenylacridines.

Photoinitiators which generate acid are well known and have been extensively reviewed, as, for example, in Pure Appl. Chem. 1992, 64, pp. 1239-48, and Prog. Polym. Sci. 1996, 21, pp. 1-45. Exemplary types of such photoinitiators include, but are not limited to: onium compounds, such as aryldiazonium compounds, triarylsulfonium compounds, triarylselenium compounds and diaryliodonium compounds; derivatives of sulfonic acids, such as o-nitrobenzyl esters of sulfonic acids, alpha-sulfonyloxyketones, N-hydroxy-amide sulfonates, N-hydroxyimine sulfonates, and imino-sulfonates; and halogenated compounds, such as trichloromethyl-1,3,5-triazines and trichloromethyl cyclohexadienones.

Photoinitiators which generate base are well known and have been extensively reviewed, as, for example, in Pure Appl. Chem. 1992, 64, pp. 1239-48, Prog. Polym. Sci. 1996, 21, pp. 1-45, and Prog. Polym. Sci. 34 (2009) pp. 194-209. Exemplary types of such photoinitiators include, but are not limited to: carbamates; O-acyloximes; quaternary ammonium salts; sulfonamides; formamides; nifedipines; metallocenes; amineimides; alpha-aminoketones; amidine precursors; and aromatic ureas.

In some embodiments, the photoinitiator generates more than one kind of reactive species. In some embodiments, the photoinitiator generates free radicals and acid.

In some embodiments, the photoinitiator is an onium salt.

In some embodiments, the photoinitiator is a diaryliodonium salt or a triarylsulfonium salt.

In some embodiments, the photoinitiator is a free radical generator.

In some embodiments, the activating radiation has a wavelength greater than 300 nm. Some exemplary photoinitiators which are sensitive to wavelengths greater than 300 nm include, but are not limited to, thioxanthen-9-one; phenanthrenequinone; diphenyl(2,4,6-trimethylbenzoyl)phoshpine oxide in combination with 2-hydroxy-2-methylpropiophenone; 4-(dimethylamino)benzophenone; dibenzosuberenone; 4,4'-bis(dimethylamino)benzophenone; camphorquinone; 2-chlorothioxanthen-9-one; 2-benzyl-2-(dimethylamino)-4'-morpholinobutyrophenone; 4,4'-bix(diethylamino)benzophenone; benzenetricarbonylchromium; 2-(4-methoxystyryl)-4,6-bis(trichloromethyl)-1,3,5-triazine; 3,5-pyridinedicarboxylic acid, 1,4-dihydro-2,6-dimethyl-4-(2-nitrophenyl)-, dimethyl ester; bis(cyclohexylsulfonyl)diazomethane; bis(p-toluenesulfonyl)diazomethane; triphenylsulfonium trifluoromethane sulfonate; triphenylsulfonium nonafluorobutanesulfonate; diphenyl-4-methylphenylsulfonium trifluoromethanesulfonate; diphenyl-2,4,6-trimethylphenyl-sulfonium p-toluenesulfonate; bis(4-tert-butylphenyl)iodonium nonafluorobutanesulfonate; borate or methide salts of

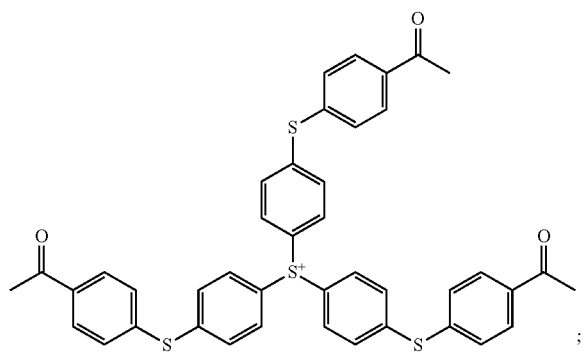

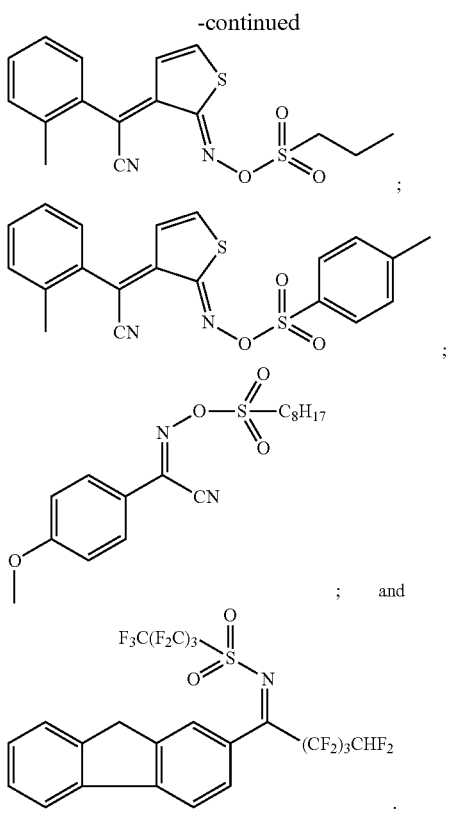

Many of these photoinitiators are commercially available.

The photoinitiator is present in an effective amount. By this it is meant that enough photoinitiator is present so that the active species generated by the activating radiation will react to allow development, as discussed below. It will be understood that the solubility of the photoinitiator may be a factor. The photoinitiator is generally present in amounts from 0.001% to 10.0% by weight, based on the total weight of the priming layer; in some embodiments, 0.005% to 2.0%.

c. First Layer Composition

In some embodiments, the first layer comprises a fluorinated acid polymer and a photoinitiator. In some embodiments, the first layer consists essentially of a fluorinated acid polymer and a photoinitiator, where components that would materially alter the principle of operation or the distinguishing characteristics of the first layer are not present.

In some embodiments, the first layer comprises a conductive polymer doped with a fluorinated acid polymer and a photoinitiator. In some embodiments, the first layer consists essentially of a conductive polymer doped with a fluorinated acid polymer and a photoinitiator, where components that would materially alter the principle of operation or the distinguishing characteristics of the first layer are not present.

In some embodiments, the first layer comprises a conductive polymer doped with a fluorinated acid polymer, a photoinitiator, and inorganic nanoparticles. In some embodiments, the first layer consists essentially of a conductive polymer doped with a fluorinated acid polymer, a photoinitiator, and inorganic nanoparticles, where components that would materially alter the principle of operation or the distinguishing characteristics of the first layer are not present.

In some embodiments, the first layer comprises a fluorinated acid polymer, a conductive polymer doped with a non-fluorinated acid polymer, and a photoinitiator. In some embodiments, the first layer consists essentially of a fluorinated acid polymer, a conductive polymer doped with a non-fluorinated acid polymer, and a photoinitiator, where components that would materially alter the principle of operation or the distinguishing characteristics of the first layer are not present.

In some embodiments, the first layer comprises a fluorinated acid polymer, a conductive polymer doped with a non-fluorinated acid polymer, a photoinitiator, and inorganic nanoparticles. In some embodiments, the first layer consists essentially of a fluorinated acid polymer, a conductive polymer doped with a non-fluorinated acid polymer, a photoinitiator, and inorganic nanoparticles, where components that would materially alter the principle of operation or the distinguishing characteristics of the first layer are not present.

Any one or more of the above embodiments can be combined with any one or more of the embodiments for the fluorinated material and any one or more of the above embodiments for the photoinitiator, so long as they are not mutually exclusive. For example, the embodiment in which the fluorinated material is a conductive polymer doped with a fluorinated acid polymer can be combined with the embodiment in which the photoinitiator is one which generates a free radical. This can further be combined with the embodiment in which the first layer consists essentially of a conductive polymer doped with a fluorinated acid polymer, a photoinitiator, and inorganic nanoparticles. The same is true for the other non-mutually-exclusive embodiments discussed above. The skilled person would understand which embodiments were mutually exclusive and would thus readily be able to determine the combinations of embodiments that are contemplated by the present application.

The thickness of the first layer will vary with its ultimate function.

In some embodiments, the first layer has a thickness in the range of 5-500 nm. In some embodiments, the first layer has a thickness in the range of 10-200 nm. In some embodiments, the first layer has a thickness in the range of 20-100 nm.

d. Aromatic Amine

The aromatic amine compound has at least one aromatic amine group. As used herein, the term "aromatic amine group" is intended to include carbazole groups.

The aromatic amine compound can be substituted. In some embodiments, the substituents are selected from the group consisting of D, alkyl, alkoxy, silyl, siloxane, and deuterated analogs thereof.

In some embodiments, the aromatic amine compound has no conventional polymerizable or crosslinkable groups.

In some embodiments, the aromatic amine compound has two or more aromatic amine groups.

In some embodiments, each amino nitrogen is bonded to at least two aromatic groups.

In some embodiments, each amino nitrogen is bonded to three aromatic groups.

There is no particular restriction on the type of compound for the aromatic amine. The aromatic amine compound can be a small molecule, dimer, star-shaped molecule, dendrimer, oligomer, or polymer, where the term "polymer" includes homopolymers and copolymers.

In some embodiments, the aromatic amine is a small molecule having a molecular weight less than 200.

In some embodiments, the aromatic amine is a polymer having five or more repeat units.

In some embodiments, the aromatic amine is deuterated. The term "deuterated" is intended to mean that at least one hydrogen ("H") has been replaced by deuterium ("D"). The term "deuterated analog" refers to a structural analog of a compound or group in which one or more available hydrogens have been replaced with deuterium. In a deuterated compound or deuterated analog, the deuterium is present in at least 100 times the natural abundance level.

In some embodiments, the aromatic amine is at least 10% deuterated. By "% deuterated" or "% deuteration" is meant the ratio of deuterons to the sum of protons plus deuterons, expressed as a percentage. In some embodiments, the aromatic amine is at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

In some embodiments, the aromatic amine is a hole transport material. Aromatic amines having hole transport properties are widely known. Such materials have been reviewed in, for example, Macromol. Mater. Eng, 2002, 287, 442-461, and have been disclosed in, for example, U.S. Pat. Nos. 5,061,569; 5,728,801; 5,929,194; 6,309,763; 7,402,701 and 7,772,360; published US patent applications 2003/0118866; 2004/0189190; and 2005/0209422; and published PCT patent applications WO2008/024378; WO2008/024379; WO2008/150940; and WO2009/067419.

In some embodiments, the aromatic amine has one of the general formulas shown below.

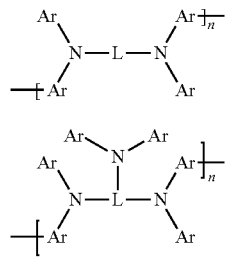

where:
  Ar is the same or different at each occurrence and is an aryl group or deuterated aryl group;
  L is a linking group; and
  n is an integer greater than 0.

In some embodiments, the compound having one of formulas (1)-(3) is non-polymeric and n=1. In this case, there is no additional group linked to the terminal Ar groups.

In some embodiments, the compound having one of formulas (1)-(3) is a dimer and n=2.

In some embodiments, the compound having one of formulas (1)-(3) is oligomeric and n=3-5.

In some embodiments, the compound having one of formulas (1)-(3) is polymeric and $n=6-10^6$.

In some embodiments of formulas (1)-(3), Ar is selected from the group consisting of phenyl, naphthyl, anthryl, phenylnaphthyl, naphthylphenyl, substituted analogs thereof, deuterated analogs thereof, substituted deuterated analogs thereof, and a group having formula (a)

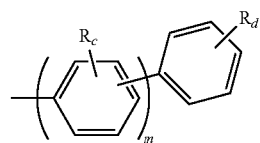

where:
  R is the same or different at each occurrence and is selected from the group consisting of D, alkyl, alkoxy, silyl, siloxane, diarylamino, and deuterated analogs thereof, or adjacent R groups can join together to form a fused 5- or 6-membered aromatic or aliphatic ring;
  c is the same or different at each occurrence and is an integer from 0-4;
  d is an integer from 0-5; and
  m is an integer from 1 to 5.

In some embodiments, substituent groups are selected from the group consisting of D, alkyl, alkoxy, silyl, siloxane, diarylamino, and deuterated analogs thereof.

In some embodiments of formulas (2)-(3), L is selected from the group consisting of polycyclic aromatic groups, two or more polycyclic aromatic groups joined by single bonds, substituted analogs thereof, deuterated analogs thereof, and substituted deuterated analogs thereof.

In some embodiments of formula (2), L is selected from the group consisting of phenyl, naphthyl, anthryl, biphenyl, binaphthyl, anthryl, bianthryl, substituted analogs thereof, deuterated analogs thereof, substituted deuterated analogs thereof, and a group having formula (b)

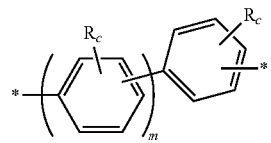

where R, c, and m are as defined for formula (a), and the asterisk indicates the point of attachment to an amino nitrogen in formula (2).

In some embodiments of formula (3), L is selected from the group consisting of phenyl, naphthyl, anthryl, biphenyl, binaphthyl, anthryl, bianthryl, substituted analogs thereof, deuterated analogs thereof, substituted deuterated analogs thereof, and a group having formula (c)

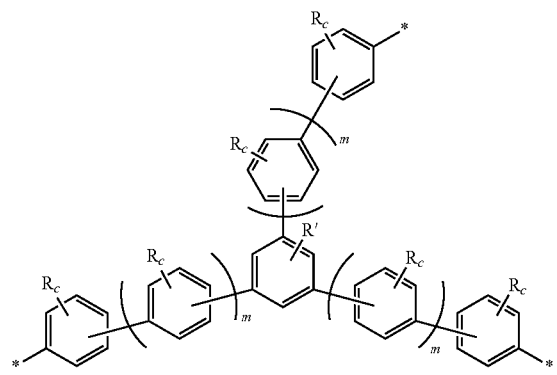

where R, c, and m are as defined for formula (a), where m can be the same or different at each occurrence, the asterisk indicates the point of attachment to an amino nitrogen in formula (3), and R' indicates 0-3 deuterium substituents.

In some embodiments of formula (2), L has formula (d).

  (d)

where
Ar' is the same or different at each occurrence and is selected from the group consisting of a single bond and an aryl group; and
L' is selected from the group consisting of O, S, alkyl, silyl, a spiro group, an adamantyl group, bicyclic cyclohexyl, substituted analogs thereof, deuterated analogs thereof, substituted deuterated analogs thereof, and combinations thereof.

In some embodiments of formula (3), L has formula (e).

  (e)

where Ar' and L' are as defined above for formula (d).

In some embodiments, the aromatic amine is a polymer including other repeating units. In some embodiments, the aromatic amine has one of formulas (4) to (9).

  (4)

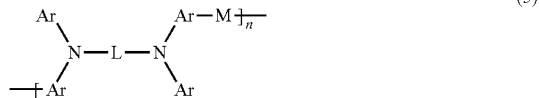  (5)

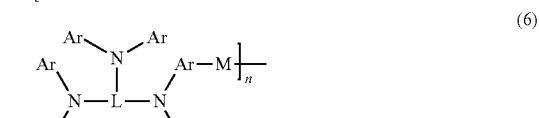  (6)

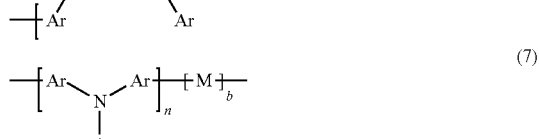  (7)

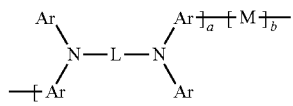  (8)

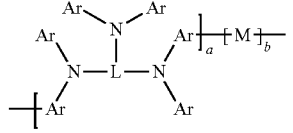  (9)

where Ar, L, and n are as defined above, M is the same or different at each occurrence and is an aromatic group, and a and b represent relative mole fractions, such that a+b=1.

In some embodiments, M is selected from the group consisting of fluorene, carbazole, N-heterocyclic, dibenzofuran, dibenzopyran, dibenzothiophene, and deuterated analogs thereof.

In some embodiments, a is equal to or greater than about 0.5; in some embodiments, equal to or greater than about 0.7.

In some embodiments, the aromatic amine includes conjugated moieties which are connected in a non-planar configuration. Such materials have been described in published PCT application WO 2009/067419.

Some exemplary small molecule aromatic amines include, but are not limited to, 4,4',4''-tris(N,N-diphenyl-amino)-triphenylamine (TDATA); 4,4',4''-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); triphenylamine (TPA); bis[4-(N,N-diethylamino)-2-methylphenyl](4-methylphenyl)methane (MPMP); 1,2-trans-bis(9H-carbazol-9-yl)cyclobutane (DCZB); N,N,N',N'-tetrakis(4-methylphenyl)-(1,1'-biphenyl)-4,4'-diamine (TTB); and N,N'-bis(naphthalen-1-yl)-N,N'-bis-(phenyl)benzidine (α-NPB).

In some embodiments, the aromatic amine compound is selected from the group consisting of polymeric triarylamines, polycarbazoles, polymeric triarylamines having conjugated moieties which are connected in a non-planar configuration, copolymers of fluorene and triarylamine, deuterated analogs thereof, and combinations thereof.

Some exemplary polymeric aromatic amine compounds include, but are not limited to, the polymers shown below.

Polymer A1

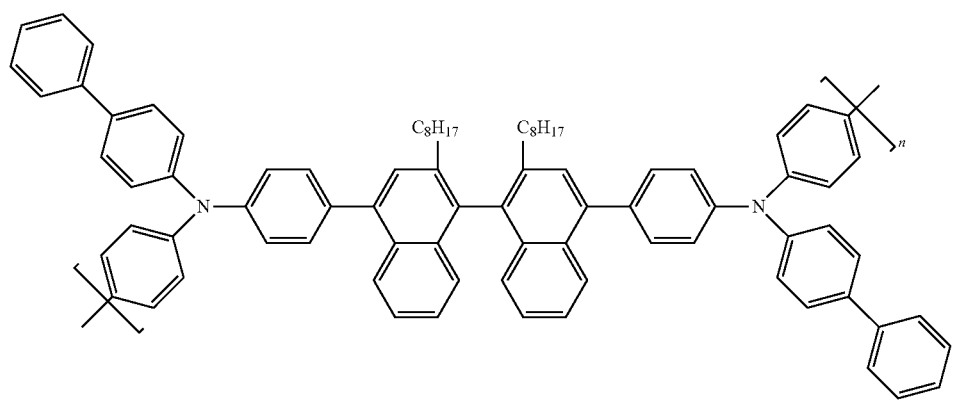

Polymer A2
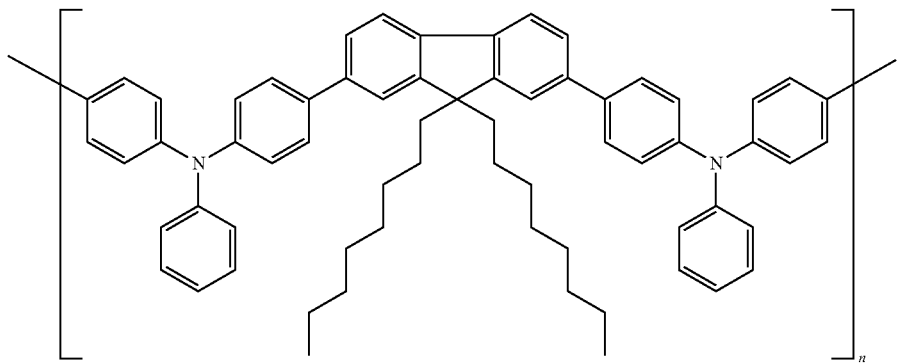
Polymer A3
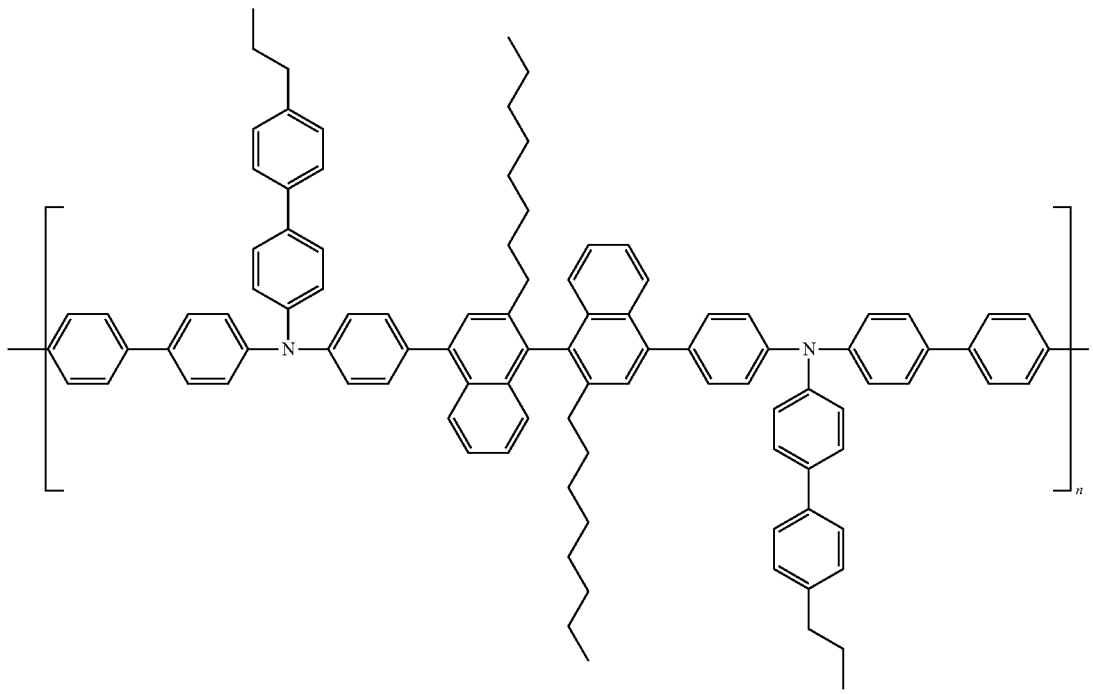
Polymer A4
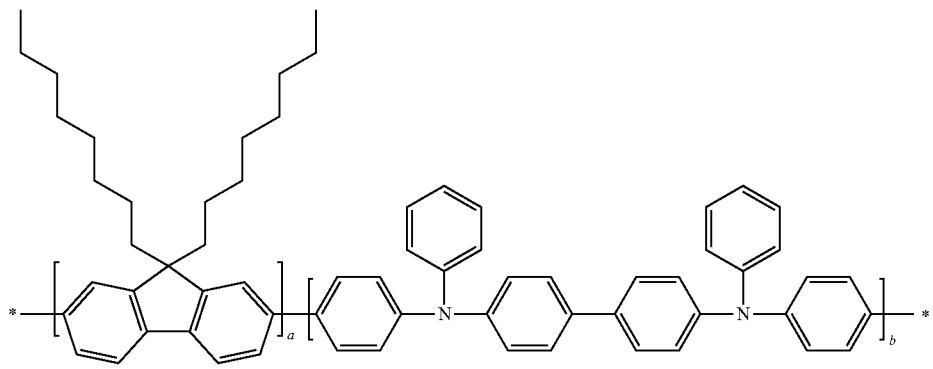
a:b = 1:1 molar ratio

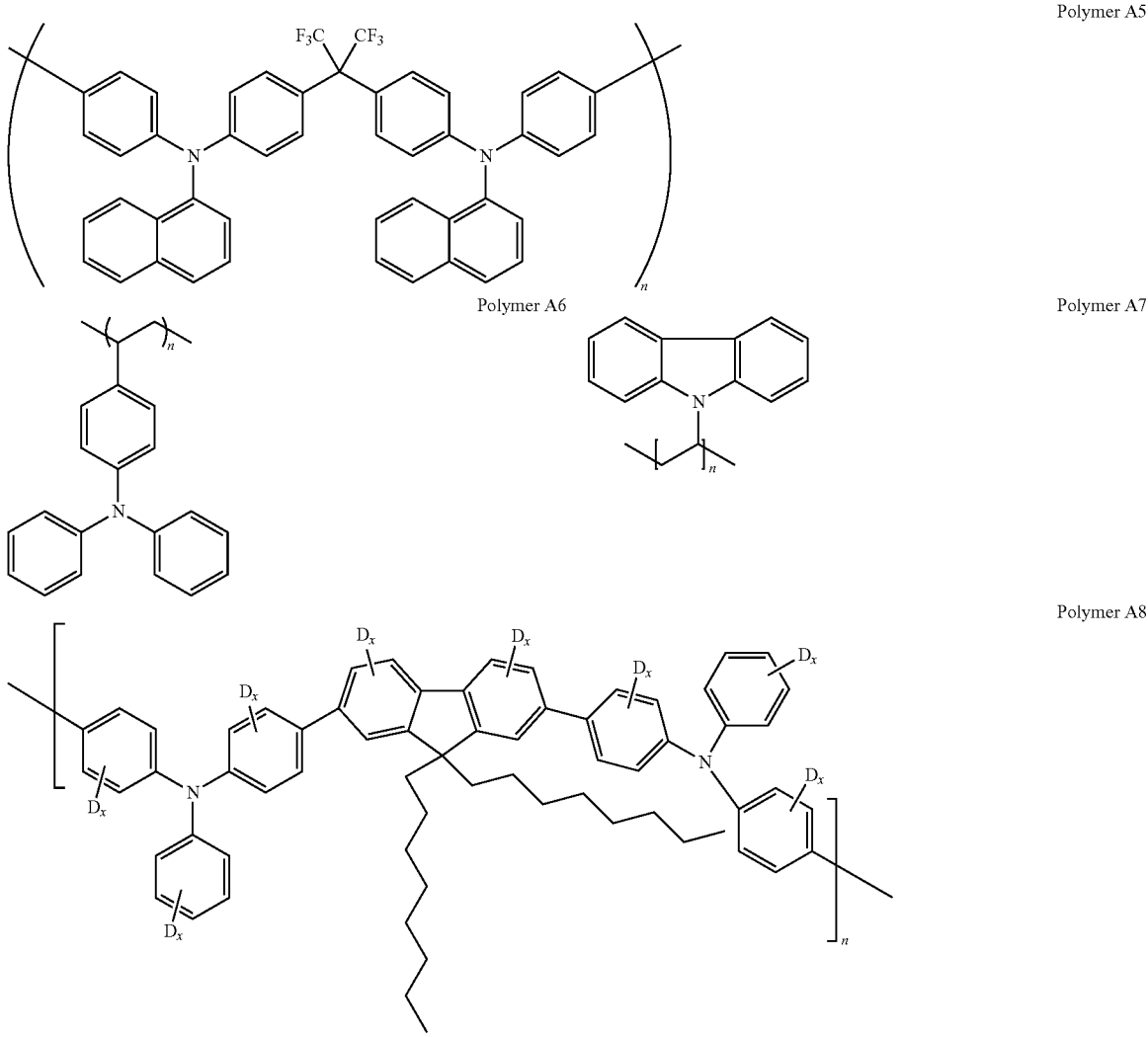

x is 0-5 and $\Sigma(x)$=10-32

In some embodiments, the above polymers are made up of two or more different isomers.

The thickness of the priming layer will vary with its ultimate function.

In some embodiments, the priming layer has a thickness in the range of 0.1-500 nm. In some embodiments, the priming layer has a thickness in the range of 1-200 nm. In some embodiments, the priming layer has a thickness in the range of 5-50 nm.

e. Process Steps

In Process I, a first layer is formed, a priming layer is formed over the first layer, the priming layer is exposed to activating radiation in a pattern, the priming layer is developed to effectively remove the priming layer from the unexposed areas, resulting in a first layer having a patterned priming layer thereon.

By the terms "effectively remove" and "effective removal" it is meant that the priming layer is essentially completely removed in unexposed areas. The areas where the priming layer is effectively removed, function as if no priming material is present. The priming layer may also be partially removed in the exposed areas, so that the remaining pattern of priming layer may be thinner than the original priming layer. The pattern of priming layer has a surface energy that is higher than the surface energy of the first layer. A second layer is formed by liquid deposition over and directly on the pattern of priming layer on the first layer.

One way to determine the relative surface energies, is to compare the contact angle of a given liquid on the first organic layer to the contact angle of the same liquid on the priming layer after exposure and development (hereinafter referred to as the "developed priming layer"). As used herein, the term "contact angle" is intended to mean the angle Φ shown in FIG. 1. For a droplet of liquid medium, angle Φ is defined by the intersection of the plane of the surface and a line from the outer edge of the droplet to the surface. Furthermore, angle Φ is measured after the droplet has reached an equilibrium position on the surface after being applied, i.e. "static contact angle". The contact angle increases with decreasing surface energy. A variety of manufacturers make equipment capable of measuring contact angles.

In some embodiments, the first layer has a contact angle with methyl benzoate of greater than 40°; in some embodiments, greater than 50°; in some embodiments, greater than 60°; in some embodiments, greater than 70°. In some embodiments, the developed priming layer, has a contact angle with anisole of less than 30°; in some embodiments, less than 20°;

in some embodiments, less than 10°. In some embodiments, for a given solvent, the contact angle with the developed priming layer is at least 20° lower than the contact angle with the first layer; In some embodiments, for a given solvent, the contact angle with the developed priming layer is at least 30° lower than the contact angle with the first layer; In some embodiments, for a given solvent, the contact angle with the developed priming layer is at least 40° lower than the contact angle with the first layer.

In some embodiments, the first layer is deposited on a substrate. The first layer can be patterned or unpatterned. In some embodiments, the first layer is an organic active layer in an electronic device.

The first layer can be formed by any deposition technique, including vapor deposition techniques, liquid deposition techniques, and thermal transfer techniques. In some embodiments, the first layer is deposited by a liquid deposition technique, followed by drying. In this case, the materials of the first layer are dissolved or dispersed in a liquid medium. The liquid deposition method may be continuous or discontinuous. Liquid deposition techniques, include but are not limited to, spin coating, roll coating, curtain coating, dip coating, slot-die coating, spray coating, continuous nozzle coating, ink jet printing, gravure printing, flexographic printing and screen printing. In some embodiments, the first layer is deposited by a continuous liquid deposition technique. The drying step can take place at room temperature or at elevated temperatures, so long as the first material and any underlying materials are not damaged.

The first layer is then treated with a priming layer. By this, it is meant that the priming material is applied over and directly in contact with the first layer to form the priming layer.

The priming layer can be applied by any known deposition process. In some embodiments, the priming layer is applied without adding it to a solvent. In some embodiments, the priming layer is applied by vapor deposition.

In some embodiments, the priming layer is applied by a condensation process. If the priming layer is applied by condensation from the vapor phase, and the surface layer temperature is too high during vapor condensation, the priming layer can migrate into the pores or free volume of an organic substrate surface. In some embodiments, the organic substrate is maintained at a temperature below the glass transition temperature or the melting temperature of the substrate materials. The temperature can be maintained by any known techniques, such as placing the first layer on a surface which is cooled with flowing liquids or gases.

In some embodiments, the priming layer is applied to a temporary support prior to the condensation step, to form a uniform coating of priming layer. This can be accomplished by any deposition method, including liquid deposition, vapor deposition, and thermal transfer. In some embodiments, the priming layer is deposited on the temporary support by a continuous liquid deposition technique. The choice of liquid medium for depositing the priming layer will depend on the exact nature of the priming layer itself. In some embodiments, the material is deposited by spin coating. The coated temporary support is then used as the source for heating to form the vapor for the condensation step.

Application of the priming layer can be accomplished utilizing either continuous or batch processes. For instance, in a batch process, one or more devices would be coated simultaneously with the priming layer and then exposed simultaneously to a source of radiation. In a continuous process, devices transported on a belt or other conveyer device would pass a station when they are sequentially coated with priming layer and then continue past a station where they are sequentially exposed to a source of radiation. Portions of the process may be continuous while other portions of the process may be batch.

In some embodiments, the priming material is a liquid at room temperature and is applied by liquid deposition over the first layer. The liquid priming material may be film-forming or it may be absorbed or adsorbed onto the surface of the first layer. In some embodiments, the liquid priming material is cooled to a temperature below its melting point in order to form a second layer over the first layer. In some embodiments, the priming material is not a liquid at room temperature and is heated to a temperature above its melting point, deposited on the first layer, and cooled to room temperature to form a second layer over the first layer. For the liquid deposition, any of the methods described above may be used.

In some embodiments, the priming layer is deposited from a second liquid composition. The liquid deposition method can be continuous or discontinuous, as described above. In some embodiments, the priming liquid composition is deposited using a continuous liquid deposition method. The choice of liquid medium for depositing the priming layer will depend on the exact nature of the priming material itself.

After the priming layer is formed, it is exposed to activating radiation. One or more of the other layers may also be exposed to radiation in this step. The type of radiation used will depend upon the sensitivity of the priming layer as discussed above. The exposure is patternwise. As used herein, the term "patternwise" indicates that only selected portions of a material or layer are exposed. Patternwise exposure can be achieved using any known imaging technique. In some embodiments, the pattern is achieved by exposing through a mask. In some embodiments, the pattern is achieved by exposing only select portions with a rastered laser. The time of exposure can range from seconds to minutes, depending upon the specific chemistry of the priming layer used. When lasers are used, much shorter exposure times are used for each individual area, depending upon the power of the laser. The exposure step can be carried out in air or in an inert atmosphere, depending upon the sensitivity of the materials.

In some embodiments, the radiation has a wavelength in the range of 300 to 450 nm. In some embodiments, it is convenient to use a medium-pressure mercury vapor lamp for the exposure. The exposure can be carried out at 365 nm (I-line), at 405 nm (H-line) or at 436 nm (G-line), depending on the sensitivity of the photoinitiator. For large devices, such as for large format display substrates, lithography tools are available for these wavelengths, while the lithography tools are not available for shorter wavelengths in the deep UV.

In some embodiments, the exposure step takes place through the substrate. The substrates of interest, and particularly glass, are not sufficiently transmissive to make this possible for wavelengths less than 300 nm. Thus, in some embodiments of the process described herein, it is possible to expose through the substrate and use the bus lines and other device architecture to form a built-in exposure mask to provide the patterning.

When the priming layer is exposed through the display substrate, the opaque regions around the pixel act as a self-aligning photo mask, eliminating the need for a separate photo mask and a complex and expensive mask aligner. The opaque boundary defining the region receiving the exposure may require additional design considerations. For example, the normal or convenient location of opaque features such as bus lines, transistors, etc., may need to be adjusted, or augmented by additional opaque features. If an organic layer is used to cover the display circuitry (for example, to prevent current flow between bus lines and the cathode layer) then the organic layer may benefit from containing a UV-absorbing material (e.g., a filler) to prevent light from scattering as it passes through the organic layer.

After patternwise exposure to radiation, the priming layer is developed. Development can be accomplished by any known technique. Such techniques have been used extensively in the photoresist and printing art. Examples of development techniques include, but are not limited to, application of heat (evaporation), treatment with a liquid medium (washing), treatment with an absorbant material (blotting), treatment with a tacky material, and the like. The development step results in effective removal of the priming layer in the unexposed areas. The priming layer then remains in the exposed areas. The priming layer may also be partially removed in the exposed areas, but enough must remain in order for there to be a wettability difference between the exposed areas of the priming material and unexposed and uncovered areas of the first layer.

In some embodiments, the exposure of the priming layer to radiation results in a change in the solubility or dispersibility of the priming layer in solvents. In this case, development can be accomplished by a wet development treatment. The treatment usually involves washing with a solvent which dissolves, disperses or lifts off one type of area.

In some embodiments, the exposure of the priming layer to radiation results in a reaction which changes the volatility of the priming layer in exposed areas. In this case, development can be accomplished by a thermal development treatment. The treatment involves heating to a temperature above the volatilization or sublimation temperature of the more volatile material and below the temperature at which the material is thermally reactive.

In some embodiments, the exposure of the priming layer to radiation results in a change in the temperature at which the material melts, softens or flows. In this case, development can be accomplished by a dry development treatment. A dry development treatment can include contacting an outermost surface of the element with an absorbent surface to absorb or wick away the softer portions. This dry development can be carried out at an elevated temperature, so long as it does not further affect the properties of the remaining areas.

The development step results in areas of priming layer that remain and areas in which the underlying first layer is uncovered. In some embodiments, the difference in contact angle with a given solvent for the patterned priming layer and uncovered areas is at least 20°; in some embodiments, at least 30°; in some embodiments, at least 40°.

The second layer is then applied by liquid deposition over and directly on the developed pattern of priming material on the first layer. In some embodiments, the second layer is a second organic active layer in an electronic device.

The second layer can be applied by any liquid deposition technique. A liquid composition comprising a second material dissolved or dispersed in a liquid medium, is applied over the pattern of developed priming layer, and dried to form the second layer. The liquid composition is chosen to have a surface energy that is greater than the surface energy of the first layer, but approximately the same as or less than the surface energy of the developed priming layer. Thus, the liquid composition will wet the developed priming layer, but will be repelled from the first layer in the areas where the priming layer has been removed. The liquid may spread onto the uncovered first layer area, but it will de-wet and be contained to the pattern of the developed priming layer. In some embodiments, the second layer is applied by a continuous liquid deposition technique, as described above.

In some embodiments of the process provided herein, the first and second layers are organic active layers. The first organic active layer is formed over a first electrode, a priming layer is formed over the first organic active layer, exposed to radiation and developed to form a pattern of developed priming layer, and the second organic active layer is formed over the developed priming layer on the first organic active layer, such that it is present only over and in the same pattern as the priming layer.

In some embodiments, the first organic active layer is formed by liquid deposition of a first liquid composition comprising the first organic active material and a first liquid medium. The liquid composition is deposited over the first electrode layer, and then dried to form a layer. In some embodiments, the first organic active layer is formed by a continuous liquid deposition method. Such methods may result in higher yields and lower equipment costs.

In some embodiments, the priming layer is formed by liquid deposition of a second liquid composition comprising the priming material in a second liquid medium. The second liquid medium can be the same as or different from the first liquid medium, so long as it does not damage the first layer. The liquid deposition method can be continuous or discontinuous, as described above. In some embodiments, the priming liquid composition is deposited using a continuous liquid deposition method.

In some embodiments, the second organic active layer is formed by liquid deposition of a third liquid composition comprising the second organic active material and a third liquid medium. The third liquid medium can be the same as or different from the first and second liquid media, so long as it does not damage the first layer or the developed priming layer. In some embodiments, the second organic active layer is formed by a printing method selected from the group consisting of ink jet printing and continuous nozzle printing.

In some embodiments, a third layer is applied over the second layer, such that it is present only over and in the same pattern as the second layer. The third layer can be applied by any of the processes described above for the second layer. In some embodiments, the third layer is applied by a liquid deposition technique. In some embodiments, the third organic active layer is formed by a printing method selected from the group consisting of ink jet printing and continuous nozzle printing.

In some embodiments, the priming material is the same as the second organic active material. In some embodiments, the priming material is different from the second organic active material.

The thickness of the developed priming layer can depend upon the ultimate end use of the material. In some embodiments, the thickness of the developed priming layer is in the range of 0.1-250 nm. In some embodiments, the thickness of the developed priming layer is in the range of 10-100 nm; in some embodiments 15-50 nm. In some embodiments, the developed priming layer is less than 10 nm in thickness. In some embodiments, the thickness is in the range of 0.1-5 nm; in some embodiments 0.5-3 nm.

In the process, any one or more of the above embodiments for any step can be combined with any one or more of the above embodiments for any of the other steps, so long as they are not mutually exclusive.

In the process, any one or more of the above embodiments for the first layer can be combined with any one or more of the above embodiments for the priming layer, so long as they are not mutually exclusive.

Furthermore, any of these combinations of process steps can be used with any one or more of the above embodiments for the first layer and any one or more of the embodiments for the priming layer, so long as they are not mutually exclusive.

The skilled person would understand which embodiments were mutually exclusive and would thus readily be able to determine the combinations of embodiments that are contemplated by the present application.

3. Process II

Process II comprises:
forming a first layer comprising a fluorinated material, said first layer having a first surface energy;
forming an intermediate layer on the first layer, said intermediate layer comprising a photoinitiator;
treating the intermediate layer with a priming layer consisting essentially of an aromatic amine compound, where components that would materially alter the principle of operation or the distinguishing characteristics of the priming layer are not present;
exposing the priming layer patternwise with activating radiation, resulting in exposed areas and unexposed areas;
developing the priming layer to effectively remove the priming layer and the intermediate layer from the unexposed areas, resulting in a first layer having thereon a patterned priming layer, wherein the patterned priming layer has a second surface energy that is higher than the first surface energy; and
forming the second layer by liquid deposition on the patterned priming layer on the first layer.

In the above process, when the priming layer is exposed to activating radiation, the material in the priming layer reacts to become less removable from the underlying first layer, relative to the unexposed priming layer. This change is enough to allow physical differentiation of the exposed and non-exposed areas and development.

In some embodiments, there is no material in the first layer having conventional polymerizable or crosslinkable groups, as defined above. The first layer comprises a fluorinated material, wherein no conventional polymerizable or crosslinkable groups are present.

In some embodiments, there is no material in the intermediate layer having conventional polymerizable or crosslinkable groups. The intermediate layer comprises a photoinitiator, wherein no conventional polymerizable or crosslinkable groups are present.

In some embodiments, there is no material in the priming layer having conventional polymerizable or crosslinkable groups. The priming layer consists essentially of an aromatic amine compound, wherein no conventional polymerizable or crosslinkable groups are present, and where other components that would materially alter the principle of operation or the distinguishing characteristics of the priming layer are not present.

In some embodiments, there is no material in the first layer, the intermediate layer or the priming layer having conventional polymerizable or crosslinkable groups. Surprisingly and unexpectedly, in the above process, the priming layer can be exposed and developed to form a pattern of exposed material, in the absence of conventional polymerizable or crosslinkable groups in any of the first later, intermediate layer or priming layer.

a. First Layer

The first layer comprises fluorinated material. Any of the fluorinated materials discussed above can be used in this layer.

In some embodiments, the first layer consists essentially of a fluorinated acid polymer, where other components that would materially alter the principle of operation or the distinguishing characteristics of the first layer are not present.

In some embodiments, the first layer comprises a conductive polymer and a fluorinated acid polymer.

In some embodiments, the first layer comprises a conductive polymer doped with a fluorinated acid polymer. In some embodiments, the first layer consists essentially of a conductive polymer doped with a fluorinated acid polymer, where other components that would materially alter the principle of operation or the distinguishing characteristics of the first layer are not present.

In some embodiments, the first layer comprises a conductive polymer doped with a fluorinated acid polymer, and inorganic nanoparticles. In some embodiments, the first layer consists essentially of a conductive polymer doped with a fluorinated acid polymer, and inorganic nanoparticles, where other components that would materially alter the principle of operation or the distinguishing characteristics of the first layer are not present.

In some embodiments, the first layer comprises a fluorinated acid polymer in admixture with a conductive polymer doped with a non-fluorinated acid polymer. In some embodiments, the first layer consists essentially of a fluorinated acid polymer in admixture with a conductive polymer doped with a non-fluorinated acid polymer, where other components that would materially alter the principle of operation or the distinguishing characteristics of the first layer are not present.

In some embodiments, the first layer comprises a fluorinated acid polymer in admixture with a conductive polymer doped with a non-fluorinated acid polymer, and further comprises inorganic nanoparticles. In some embodiments, the first layer consists essentially of a fluorinated acid polymer, a conductive polymer doped with a non-fluorinated acid polymer, and inorganic nanoparticles, where other components that would materially alter the principle of operation or the distinguishing characteristics of the first layer are not present.

The thickness of the first layer is as discussed above for Process I.

b. Intermediate Layer

The intermediate layer comprises a photoinitiator. Any of the photointiators discussed above can be used in this layer.

In some embodiments, the intermediate layer consists essentially of a photoinitiator, where other components that would materially alter the principle of operation or the distinguishing characteristics of the intermediate layer are not present.

In some embodiments, the intermediate layer comprises a photoinitiator and a binder. In some embodiments, the binder is a film-forming material. There are no particular limitations for the binder, so long as it does not deleteriously affect the desired properties of the layer and the ultimate intended use.

In some embodiments, the binder is a small molecule material. In some embodiments, the binder is a small molecule aromatic amine.

In some embodiments, the binder is a polymeric material.

In some embodiments, the binder is a non-conductive polymer. In some embodiments, the binder is selected from the group consisting of acrylate, methacrylates, polyimides, polyamides, polyesters, and polyethers.

In some embodiments, the binder is a conductive polymer. In some embodiments, the binder is selected from the group consisting of polythiophenes, polyanilines, polypyrroles, fused polycyclic aromatic polymers, substituted derivatives thereof, and combinations thereof.

In some embodiments, the intermediate layer consists essentially of a photoinitiator and a binder, where other components that would materially alter the principle of operation or the distinguishing characteristics of the intermediate layer are not present.

In some embodiments, the intermediate layer has a thickness in the range of 1-500 nm. In some embodiments, the intermediate layer has a thickness in the range of 5-200 nm. In some embodiments, the intermediate layer has a thickness in the range of 10-50 nm.

The photoinitiator is generally present in amounts from 0.001% to 10.0% by weight, based on the total weight of the intermediate layer; in some embodiments, 0.005% to 2.0% by weight.

c. Priming Layer

The priming layer consists essentially of an aromatic amine compound, where other components that would materially alter the principle of operation or the distinguishing characteristics of the priming layer are not present. Any of the aromatic amines discussed above can be used in this layer.

The thickness of the priming layer is as discussed above for Process I.

d. Process Steps

In Process II, a first layer is formed, an intermediate layer is formed over the first layer, a priming layer is formed over the intermediate layer, the priming layer is exposed to radiation in a pattern, the priming layer is developed to effectively remove the priming layer and the intermediate layer from the unexposed areas, resulting in a first layer having a patterned priming layer thereon. By the terms "effectively remove" and "effective removal" it is meant that the priming layer and the intermediate layer are essentially completely removed in unexposed areas. The areas where the priming layer and intermediate layer are effectively removed, function as if no priming material or intermediate layer material are present. The priming layer may also be partially removed in the exposed areas, but not completely removed. Thus the remaining pattern of priming layer may be thinner than the original priming layer. The pattern of priming layer has a surface energy that is higher than the surface energy of the first layer. A second layer is formed by liquid deposition over and directly on the pattern of priming layer on the first layer.

The relative surface energies can be determined by comparing contact angle with a given liquid as discussed above.

In some embodiments, the first layer has a contact angle with methyl benzoate of greater than 40°; in some embodiments, greater than 50°; in some embodiments, greater than 60°; in some embodiments, greater than 70°. In some embodiments, the developed priming layer, has a contact angle with anisole of less than 30°; in some embodiments, less than 20°; in some embodiments, less than 10°. In some embodiments, for a given solvent, the contact angle with the developed priming layer is at least 20° lower than the contact angle with the first layer; In some embodiments, for a given solvent, the contact angle with the developed priming layer is at least 30° lower than the contact angle with the first layer; In some embodiments, for a given solvent, the contact angle with the developed priming layer is at least 40° lower than the contact angle with the first layer.

In some embodiments, the first layer is deposited on a substrate. The first layer can be patterned or unpatterned. In some embodiments, the first layer is an organic active layer in an electronic device.

The first layer can be formed by any deposition technique, including vapor deposition techniques, liquid deposition techniques, and thermal transfer techniques. In some embodiments, the first layer is deposited by a liquid deposition technique, followed by drying. In this case, the materials of the first layer are dissolved or dispersed in a liquid medium. The liquid deposition method may be continuous or discontinuous. Liquid deposition techniques, include but are not limited to, spin coating, roll coating, curtain coating, dip coating, slot-die coating, spray coating, continuous nozzle coating, ink jet printing, gravure printing, flexographic printing and screen printing. In some embodiments, the first layer is deposited by a continuous liquid deposition technique. The drying step can take place at room temperature or at elevated temperatures, so long as the first material and any underlying materials are not damaged.

An intermediate layer is then formed on the first layer. The intermediate layer can be applied by any known deposition process.

In some embodiments, the intermediate layer is applied without adding it to a solvent. In some embodiments, the intermediate layer is applied by vapor deposition.

In some embodiments, the material of the intermediate layer is a liquid at room temperature and is applied by liquid deposition over the first layer.

In some embodiments, the material of the intermediate layer is deposited from a second liquid composition. The liquid deposition method can be continuous or discontinuous, as described above. In some embodiments, the intermediate layer liquid composition is deposited using a continuous liquid deposition method. The choice of liquid medium for depositing the intermediate layer will depend on the exact nature of the intermediate layer material itself.

The intermediate layer is then treated with a priming layer. By this, it is meant that the priming material is applied over and directly in contact with the first layer to form the priming layer.

The treatment with the priming layer can be carried out as discussed above for Process I.

After the priming layer is formed, it is exposed to radiation, as discussed above for Process I.

After patternwise exposure to radiation, the priming layer is developed as discussed above for Process I. The development step removes the priming layer in the unexposed areas and also removes the intermediate layer in those areas. The priming layer remains in the exposed areas. The priming layer may also be partially removed in the exposed areas, but enough must remain in order for there to be a wettability difference between the exposed areas of priming material and the unexposed and uncovered areas of the first layer.

The development step results in areas of priming layer that remain and areas in which the underlying first layer is uncovered. In some embodiments, the difference in contact angle with a given solvent for the patterned priming layer and uncovered areas is at least 20°; in some embodiments, at least 30°; in some embodiments, at least 40°.

The second layer is then applied by liquid deposition over and directly on the developed pattern of priming material on the first layer. In some embodiments, the second layer is a second organic active layer in an electronic device.

The second layer can be applied by any liquid deposition technique. A liquid composition comprising a second material dissolved or dispersed in a liquid medium, is applied over the pattern of developed priming layer, and dried to form the second layer. The liquid composition is chosen to have a surface energy that is greater than the surface energy of the first layer, but approximately the same as or less than the surface energy of the developed priming layer. Thus, the liquid composition will wet the developed priming layer, but will be repelled from the first layer in the areas where the priming layer has been removed. The liquid may spread onto the uncovered first layer area, but it will de-wet and be contained to the pattern of the developed priming layer. In some embodiments, the second layer is applied by a continuous liquid deposition technique, as described above.

In some embodiments of the process provided herein, the first and second layers are organic active layers. The first organic active layer is formed over a first electrode, a priming layer is formed over the first organic active layer, exposed to radiation and developed to form a pattern of developed priming layer, and the second organic active layer is formed over the developed priming layer on the first organic active layer, such that it is present only over and in the same pattern as the priming layer.

In some embodiments, the first organic active layer is formed by liquid deposition of a first liquid composition comprising the first organic active material and a first liquid medium. The liquid composition is deposited over the first electrode layer, and then dried to form a layer. In some embodiments, the first organic active layer is formed by a continuous liquid deposition method. Such methods may result in higher yields and lower equipment costs.

In some embodiments, the priming layer is formed by liquid deposition of a second liquid composition comprising the priming material in a second liquid medium. The second liquid medium can be the same as or different from the first liquid medium, so long as it does not damage the first layer. The liquid deposition method can be continuous or discontinuous, as described above. In some embodiments, the priming liquid composition is deposited using a continuous liquid deposition method.

In some embodiments, the second organic active layer is formed by liquid deposition of a third liquid composition comprising the second organic active material and a third liquid medium. The third liquid medium can be the same as or different from the first and second liquid media, so long as it does not damage the first layer or the developed priming layer. In some embodiments, the second organic active layer is formed by a printing method selected from the group consisting of ink jet printing and continuous nozzle printing.

In some embodiments, a third layer is applied over the second layer, such that it is present only over and in the same pattern as the second layer. The third layer can be applied by any of the processes described above for the second layer. In some embodiments, the third layer is applied by a liquid deposition technique. In some embodiments, the third organic active layer is formed by a printing method selected from the group consisting of ink jet printing and continuous nozzle printing.

In some embodiments, the priming material is the same as the second organic active material. In some embodiments, the priming material is different from the second organic active material.

The thickness of the developed priming layer can depend upon the ultimate end use of the material. In some embodiments, the thickness of the developed priming layer is in the range of 0.1-250 nm. In some embodiments, the thickness of the developed priming layer is in the range of 10-100 nm; in some embodiments 15-50 nm. In some embodiments, the developed priming layer is less than 10 nm in thickness. In some embodiments, the thickness is in the range of 0.1-5 nm; in some embodiments 0.5-3 nm.

In the process, any one or more of the above embodiments for any step can be combined with any one or more of the above embodiments for any of the other steps, so long as they are not mutually exclusive.

In the process, any one or more of the above embodiments for the first layer can be combined with any one or more of the above embodiments for the intermediate layer and any one or more of the above embodiments for the priming layer, so long as they are not mutually exclusive.

Furthermore, any of these combinations of process steps can be used with any one or more of the above embodiments for the first layer and any one or more of the embodiments for the intermediate layer and any one or more of the embodiments for the priming layer, so long as they are not mutually exclusive.

The skilled person would understand which embodiments were mutually exclusive and would thus readily be able to determine the combinations of embodiments that are contemplated by the present application.

4. Organic Electronic Device

Both Process I and Process II will be further described in terms of the application in an electronic device, although the processes are not limited to such application. In the following discussion, the term "the process" and "the new process" refer to both Process I and Process II, unless explicity stated otherwise.

Figure 2:
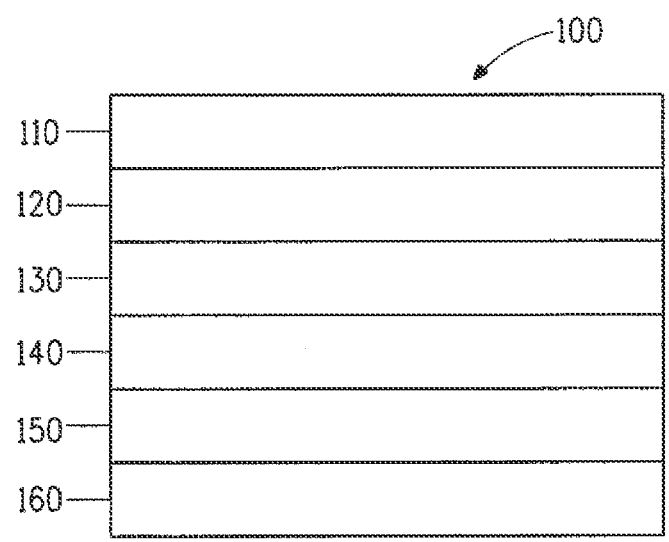
FIG. 2 includes an illustration of an organic electronic device.

FIG. 2 is an exemplary electronic device, an organic light-emitting diode (OLED) display that includes at least two organic active layers positioned between two electrical contact layers. The electronic device 100 includes one or more layers 120 and 130 to facilitate the injection of holes from the anode layer 110 into the photoactive layer 140. In general, when two layers are present, the layer 120 adjacent the anode is called the hole injection layer, sometimes called a buffer layer. The layer 130 adjacent to the photoactive layer is called the hole transport layer. An optional electron transport layer 150 is located between the photoactive layer 140 and a cathode layer 160. The organic layers 120 through 150 are individually and collectively referred to as the organic active layers of the device. Depending on the application of the device 100, the photoactive layer 140 can be a light-emitting layer that is activated by an applied voltage (such as in a light-emitting diode or light-emitting electrochemical cell) or a layer of material that responds to radiant energy and generates a signal with or without an applied bias voltage (such as in a photodetector or photovoltaic cell). The device is not limited with respect to system, driving method, and utility mode. The priming layer is not shown in this diagram.

For multicolor devices, the photoactive layer 140 is made up different areas of at least three different colors. The areas of different color can be formed by printing the separate colored areas. Alternatively, it can be accomplished by forming an overall layer and doping different areas of the layer with emissive materials with different colors. Such a process has been described in, for example, published U.S. patent application 2004-0094768.

In some embodiments, the new process described herein can be used for any successive pairs of organic layers in the device, where the second layer is to be contained in a specific area.

For Process I: the process for making an organic electronic device comprising an electrode having positioned thereover a first organic active layer and a second organic active layer, comprises:

forming the first organic active layer comprising a fluorinated material and a photoinitiator, said first organic active layer having a first surface energy over the electrode;

treating the first organic active layer with a priming layer consisting essentially of an aromatic amine compound, where components that would materially alter the principle of operation or the distinguishing characteristics of the priming layer are not present;

exposing the priming layer patternwise with radiation resulting in exposed areas and unexposed areas;

developing the priming layer to remove the priming layer from the unexposed areas resulting in a first active organic layer having a pattern of priming layer, wherein the pattern of priming layer has a second surface energy that is higher than the first surface energy; and forming the second organic active layer by liquid deposition on the pattern of priming layer on the first organic active layer.

For Process II: the process for making an organic electronic device comprising an electrode having positioned thereover a first organic active layer and a second organic active layer, comprises:

forming the first organic active layer comprising a fluorinated material, said first organic active layer having a first surface energy over the electrode;

forming an intermediate layer comprising a photoinitiator over the first organic active layer;

treating the first intermediate layer with a priming layer consisting essentially of an aromatic amine compound, where components that would materially alter the principle of operation or the distinguishing characteristics of the priming layer are not present;

exposing the priming layer patternwise with radiation resulting in exposed areas and unexposed areas;

developing the priming layer to remove the priming layer and the intermediate layer from the unexposed areas, resulting in a first active organic layer having a pattern of priming layer, wherein the pattern of priming layer has a second surface energy that is higher than the first surface energy; and forming the second organic active layer by liquid deposition on the pattern of priming layer on the first organic active layer.

In some embodiments of the new process, the first organic active layer is the hole injection layer 120 and the second organic active layer is the hole transport layer 130. In some embodiments for Process I, where the device is constructed beginning with the anode layer, the priming layer is applied to hole injection layer 120 and exposed and developed prior to applying the hole transport layer 130. In some embodiments for Process II, where the device is constructed beginning with the anode layer, the intermediate layer is applied to hole injection layer 120, followed by the priming layer, which is exposed and developed prior to applying the hole transport layer 130.

In some embodiments of the new process, the first organic active layer is the hole injection layer 120 and the second organic active layer is the photoactive layer 140. In some embodiments for Process I, where the device is constructed beginning with the anode layer, the priming layer is applied to hole injection layer 120 and exposed and developed prior to applying the photoactive layer 140. In some embodiments for Process II, where the device is constructed beginning with the anode layer, the intermediate layer is applied to hole injection layer 120, followed by the priming layer, which is exposed and developed prior to applying the photoactive layer 140.

In some embodiments, the hole injection layer comprises a conductive polymer doped with a fluorinated acid polymer.

In some embodiments, the hole injection layer comprises a conductive polymer doped with a fluorinated acid polymer, and further comprises inorganic nanoparticles.

In some embodiments, the hole injection layer consists essentially of a conductive polymer doped with a fluorinated acid polymer, where other components that would materially alter the principle of operation or the distinguishing characteristics of the hole injection layer are not present.

In some embodiments, the hole injection layer consists essentially of a conductive polymer doped with a fluorinated acid polymer and inorganic nanoparticles, where other components that would materially alter the principle of operation or the distinguishing characteristics of the hole injection layer are not present.

In some embodiments, the hole injection layer comprises a fluorinated acid polymer in admixture with a conductive polymer doped with a non-fluorinated polymeric acid.

In some embodiments, the hole injection layer comprises a fluorinated acid polymer in admixture with a conductive polymer doped with a non-fluorinated polymeric acid, and further comprise inorganic nanoparticles.

In some embodiments, the hole injection layer consists essentially of a fluorinated acid polymer and a conductive polymer doped with a non-fluorinated polymeric acid, where other components that would materially alter the principle of operation or the distinguishing characteristics of the hole injection layer are not present.

In some embodiments, the hole injection layer consists essentially of a fluorinated acid polymer, a conductive polymer doped with a non-fluorinated polymeric acid, and inorganic nanoparticles, where other components that would materially alter the principle of operation or the distinguishing characteristics of the hole injection layer are not present.

In some embodiments, the hole injection layer 120 is made from a dispersion of a conducting polymer and a colloid-forming polymeric acid. Such materials have been described in, for example, published U.S. patent applications US 2004/0102577, US 2004/0127637, US 2005/0205860, and published PCT application WO 2009/018009.

In some embodiments of Process I, the first organic active layer is the hole injection layer 120 and the second organic active layer is the photoactive layer 140. In this embodiment, the priming layer is layer 130 and is applied at a thickness such that it also functions as the hole transport layer. In some embodiments, the hole injection layer comprises a fluorinated material. In some embodiments, the hole injection layer comprises a conductive polymer doped with a fluorinated acid polymer. In some embodiments, the hole injection layer consists essentially of a conductive polymer doped with a fluorinated acid polymer. In some embodiments, the hole injection layer 120 is made from a dispersion of a conducting polymer and a colloid-forming polymeric acid, as referenced above.

In some embodiments of Process II, the first organic active layer is the hole injection layer 120 and the second organic active layer is the photoactive layer 140. In this embodiment, the priming layer is layer 130 and is applied at a thickness such that it also functions as the hole transport layer. The intermediate layer, not shown, is between the hole injection layer 120 and the priming layer 130. In some embodiments, the hole injection layer comprises a fluorinated material. In some embodiments, the hole injection layer comprises a conductive polymer doped with a fluorinated acid polymer. In some embodiments, the hole injection layer consists essentially of a conductive polymer doped with a fluorinated acid polymer. In some embodiments, the hole injection layer 120 is made from a dispersion of a conducting polymer and a colloid-forming polymeric acid, as referenced above.

The layers in the device can be made of any materials which are known to be useful in such layers. The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 160. The anode can include materials containing a metal, mixed metal, alloy, metal oxide or mixed oxide. Suitable materials include the mixed oxides of the Group 2 elements (i.e., Be, Mg, Ca, Sr, Ba), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), aluminum-tin-oxide, aluminum-zinc-oxide, gold, silver, copper, and nickel. The anode may also comprise an organic material such as polyaniline, polythiophene, or polypyrrole.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

Usually, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

The hole injection layer 120 functions to facilitate injection of holes into the emissive layer and to planarize the anode surface to prevent shorts in the device. Hole injection materials may be polymers, oligomers, or small molecules, and may be in the form of solutions, dispersions, suspensions, emulsions, colloidal mixtures, or other compositions.

The hole injection layer can be formed with conducting polymers and fluorinated acids, as discussed above. In addition, the hole injection layer can comprise polymeric materials, such as polyaniline (PANI) or polyethylenedioxythiophene (PEDOT) doped with non-fluorinated protonic acids. The protonic acids can be, for example, poly(styrenesulfonic acid), poly(2-acrylamido-2-methyl-1-propanesulfonic acid), and the like. The hole injection layer 120 can comprise charge transfer compounds, and the like, such as copper phthalocyanine and the tetrathiafulvalene-tetracyanoquinodimethane system (TTF-TCNQ).

The hole injection layer 120 can be applied by any deposition technique. In some embodiments, the hole injection layer is applied by a solution deposition method, as described above. In some embodiments, the hole injection layer is applied by a continuous liquid deposition method.

Layer 130 comprises hole transport material. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 4,4'-bis(carbazol-9-yl) biphenyl (CBP); 1,3-bis(carbazol-9-yl)benzene (mCP); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl] (4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate.

In some embodiments, the hole transport layer comprises a hole transport polymer. In some embodiments, the hole transport polymer is a distyrylaryl compound. In some embodiments, the aryl group is has two or more fused aromatic rings. In some embodiments, the aryl group is an acene. The term "acene" as used herein refers to a hydrocarbon parent component that contains two or more ortho-fused benzene rings in a straight linear arrangement.

In some embodiments, the hole transport polymer is an arylamine polymer. In some embodiments, it is a copolymer of fluorene and arylamine monomers.

In some embodiments, the hole transport polymer has crosslinkable groups. In some embodiments, crosslinking can be accomplished by a heat treatment and/or exposure to UV or visible radiation. Examples of crosslinkable groups include, but are not limited to vinyl, acrylate, perfluorovinylether, 1-benzo-3,4-cyclobutane, siloxane, and methyl esters. Crosslinkable polymers can have advantages in the fabrication of solution-process OLEDs. The application of a soluble polymeric material to form a layer which can be converted into an insoluble film subsequent to deposition, can allow for the fabrication of multilayer solution-processed OLED devices free of layer dissolution problems.

Examples of crosslinkable polymers can be found in, for example, published US patent application 2005/0184287 and published PCT application WO 2005/052027.

In some embodiments, the hole transport polymer has no conventional polymerizable or crosslinkable groups.

In some embodiments, the hole transport layer comprises a polymer which is a copolymer of 9,9-dialkylfluorene and triphenylamine. In some embodiments, the polymer is a copolymer of 9,9-dialkylfluorene and 4,4'-bis(diphenylamino)biphenyl. In some embodiments, the polymer is a copolymer of 9,9-dialkylfluorene and TPB. In some embodiments, the polymer is a copolymer of 9,9-dialkylfluorene and NPB.

In some embodiments, the hole transport layer comprises a material comprising triarylamines having conjugated moieties which are connected in a non-planar configuration. Such materials can be monomeric or polymeric. Examples of such materials have been described in, for example, published PCT application WO 2009/067419.

In some embodiments, the hole transport layer is doped with a p-dopant, such as tetrafluorotetracyanoquinodimethane and perylene-3,4,9,10-tetracarboxylic-3,4,9,10-dianhydride.

The hole transport layer 130 can be applied by any deposition technique. In some embodiments, the hole transport layer is applied by a solution deposition method, as described above. In some embodiments, the hole transport layer is applied by a continuous solution deposition method.

Depending upon the application of the device, the photoactive layer 140 can be a light-emitting layer that is activated by an applied voltage (such as in a light-emitting diode or light-emitting electrochemical cell), a layer of material that responds to radiant energy and generates a signal with or without an applied bias voltage (such as in a photodetector). In some embodiments, the photoactive material is an organic electroluminescent ("EL") material. Any EL material can be used in the devices, including, but not limited to, small molecule organic fluorescent compounds, luminescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of luminescent metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. In some cases the small molecule fluorescent or organometallic materials are deposited as a dopant with a host material to improve processing and/or electronic properties. Examples of conjugated polymers include, but are not limited to poly(phenylenevinylenes), polyfluorenes, poly(spirobifluorenes), polythiophenes, poly(p-phenylenes), copolymers thereof, and mixtures thereof.

The photoactive layer 140 can be applied by any deposition technique. In some embodiments, the photoactive layer is applied by a solution deposition method, as described above. In some embodiments, the photoactive layer is applied by a liquid deposition method.

Optional layer 150 can function both to facilitate electron transport, and also serve as a buffer layer or confinement layer to prevent quenching of the exciton at layer interfaces. Preferably, this layer promotes electron mobility and reduces exciton quenching. Examples of electron transport materials which can be used in the optional electron transport layer 150, include metal chelated oxinoid compounds, including metal quinolate derivatives such as tris(8-hydroxyquinolato)aluminum (AlQ), bis(2-methyl-8-quinolinolato)(p-phenylphenolato)aluminum (BAlq), tetrakis-(8-hydroxyquinolato) hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. In some embodiments, the electron transport layer further comprises an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

The electron transport layer 150 can be formed by a chemical or physical vapor deposition process.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing organometallic compounds, LiF, $Li_2O$, Cs-containing organometallic compounds, CsF, $Cs_2O$, and $Cs_2CO_3$ can also be deposited between the organic layer and the cathode layer to lower the operating voltage. This may be referred to as an electron injection layer.

The cathode layer 160 is usually formed by a chemical or physical vapor deposition process.

In some embodiments, additional layers(s) may be present within organic electronic devices.

It is understood that each functional layer can be made up of more than one layer.

In some embodiments, the different layers have the following range of thicknesses: anode 110, 100-5000 Å, in some embodiments 100-2000 Å; hole injection layer 120, 50-2500 Å, in some embodiments 200-1000 Å; hole transport layer 130, 50-2500 Å, in some embodiments 200-1000 Å; emissive layer 140, 10-2000 Å, in some embodiments 100-1000 Å; electron transport layer 150, 50-2000 Å, in some embodiments 100-1000 Å; cathode 160, 200-10000 Å, in some embodiments 300-5000 Å. The desired ratio of layer thicknesses will depend on the exact nature of the materials used.

In some embodiments, there is provided an organic electronic device comprising a first organic active layer and a second organic active layer positioned over an electrode, and further comprising a patterned priming layer between the first and second organic active layers, wherein said second organic active layer is present only in areas where the priming layer is present. In some embodiments, the first organic active layer comprises a conductive polymer and a fluorinated acid polymer. In some embodiments, the second organic active layer comprises hole transport material. In some embodiments, the first organic active layer consists essentially of a conductive polymer doped with a fluorinated acid polymer and the second organic active layer consists essentially of hole transport material.

In some embodiments for Process I, there is provided a process for making an organic electronic device comprising a support having thereon, in order, an anode, a hole injection layer, and a hole transport layer, said process comprising:

providing an anode on a support;

forming a hole injection layer over the anode, said hole injection layer comprising a fluorinated material and a photoinitiator, said hole injection layer having a first surface energy;

forming a priming layer directly on the hole injection layer, said priming layer consisting essentially of an aromatic amine, where components that would materially alter the principle of operation or the distinguishing characteristics of the priming layer are not present;

exposing the priming layer patternwise with activating radiation, resulting in exposed areas and unexposed areas;

developing the priming layer to effectively remove the priming layer from the unexposed areas resulting in a pattern of developed priming layer on the hole injection layer, said developed priming layer having a second surface energy that is higher than the first surface energy; and forming a hole transport layer by liquid deposition on the developed pattern of priming layer.

Figure 3:
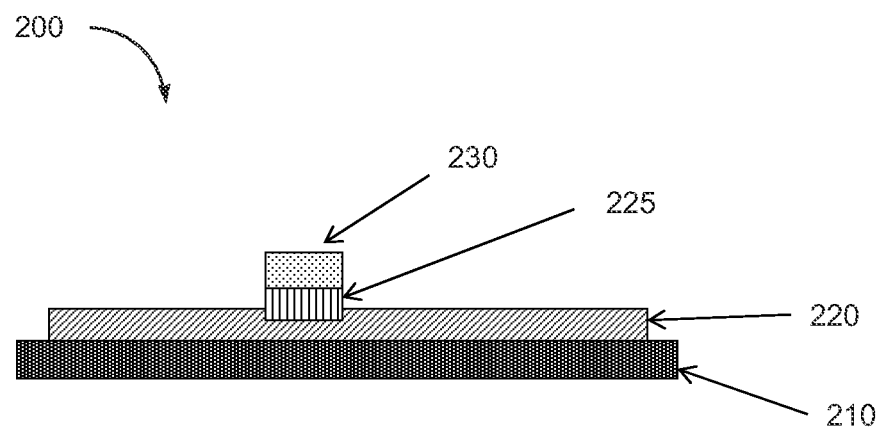
FIG. 3 includes an illustration of part of an organic electronic device having a priming layer.

This is shown schematically in FIG. 3. Device 200 has an anode 210 on a substrate (not shown). On the anode is hole injection layer 220. The developed priming layer is shown as 225. The surface energy of the hole injection layer 220 is less than the surface energy of the priming layer 225. When the hole transport layer 230 is deposited over the priming layer and hole injection layer, it does not wet the low energy surface of the hole injection layer and remains only over the pattern of the priming layer.

In some embodiments, the priming layer is exposed through the support.

In some embodiments for Process II, there is provided a process for making an organic electronic device comprising a support having thereon an anode, a hole injection layer, and a hole transport layer, said process comprising:

forming the hole injection layer over the anode, said hole injection layer comprising a fluorinated material and having a first surface energy;

forming an intermediate layer on the hole injection layer, said intermediate layer comprising a photoinitiator;

forming a priming layer directly on the intermediate layer, said priming layer consisting essentially of an aromatic amine, where components that would materially alter the principle of operation or the distinguishing characteristics of the priming layer are not present;

exposing the priming layer patternwise with activating radiation, resulting in exposed areas and unexposed areas;

developing the priming layer to effectively remove the priming layer and the intermediate layer from the unexposed areas, resulting in a pattern of developed priming layer on the hole injection layer, said developed priming layer having a second surface energy that is higher than the first surface energy; and forming a hole transport layer by liquid deposition on the developed pattern of priming layer.

In some embodiments, the priming layer is exposed through the support.

In some embodiments, the hole injection layer comprises a conductive polymer doped with a fluorinated acid polymer. In some embodiments, the hole injection layer consists essentially of a conductive polymer doped with a fluorinated acid polymer. In some embodiments, the hole injection layer consists essentially of a conductive polymer doped with a fluorinated acid polymer and inorganic nanoparticles. In some embodiments, the inorganic nanoparticles are selected from the group consisting of silicon oxides, titanium oxides, zirconium oxide, molybdenum trioxide, vanadium oxide, aluminum oxide, zinc oxide, samarium oxide, yttrium oxide, cesium oxide, cupric oxide, stannic oxide, antimony oxide, and combinations thereof. Such materials have been described in, for example, U.S. Pat. No. 7,250,461, published U.S. patent applications US 2004/0102577, US 2004/0127637, US 2005/0205860, and published PCT application WO 2009/018009.

In some embodiments, the process further comprises forming a photoactive layer by liquid deposition on the hole transport layer. In some embodiments, the photoactive layer comprises a photoactive dopant and one or more host materials. In some embodiments, the photoactive layer is formed by a liquid deposition technique selected from the group consisting of ink jet printing and continuous nozzle printing.

In some embodiments of Process I, there is provided a process for making an organic electronic device comprising an anode having thereon a hole injection layer, a priming layer, and a photoactive layer, said process comprising:

forming the hole injection layer over the anode, said hole injection layer comprising a fluorinated material and a photoinitiator, said hole injection layer having a first surface energy;

forming a priming layer directly on the hole injection layer, said priming layer consisting essentially of an aromatic amine, where components that would materially alter the principle of operation or the distinguishing characteristics of the priming layer are not present;

exposing the priming layer patternwise with activating radiation, resulting in exposed areas and unexposed areas;

developing the priming layer to effectively remove the priming layer from the unexposed areas resulting in a pattern of developed priming layer on the hole injection layer, said developed priming layer having a second surface energy that is higher than the first surface energy; and forming a photoactive layer by liquid deposition on the developed pattern of priming layer.

In this embodiment, the priming layer functions as a hole transport layer and the photoactive layer is applied directly on and in contact with the priming layer. In some embodiments, the hole injection layer comprises a conductive polymer doped with a fluorinated acid polymer, as described above.

In some embodiments, the priming layer is exposed through the support.

In some embodiments of Process II, there is provided a process for making an organic electronic device comprising an anode having thereon a hole injection layer, an intermediate layer, a priming layer, and a photoactive layer, said process comprising:

forming the hole injection layer over the anode, said hole injection layer comprising a fluorinated material, said hole injection layer having a first surface energy;

forming an intermediate layer over the hole injection layer, said intermediate layer comprising a photoinitiator;

forming a priming layer directly on the intermediate layer, said priming layer consisting essentially of an aromatic amine, where components that would materially alter the principle of operation or the distinguishing characteristics of the priming layer are not present;

exposing the priming layer patternwise with activating radiation, resulting in exposed areas and unexposed areas;

developing the priming layer to effectively remove the priming layer and the intermediate layer from the unexposed areas resulting in a pattern of developed priming layer on the hole injection layer, said developed priming layer having a second surface energy that is higher than the first surface energy; and forming a photoactive layer by liquid deposition on the developed pattern of priming layer.

In these embodiments, the priming layer functions as a hole transport layer and the photoactive layer is applied directly on and in contact with the priming layer.

In some embodiments, the hole injection layer comprises a conductive polymer doped with a fluorinated acid polymer, as described above.

In some embodiments, the intermediate layer consists essentially of a photoinitiator, where components that would materially alter the principle of operation or the distinguishing characteristics of the intermediate layer are not present.

In some embodiments, the priming layer is exposed through the support.

Any of the embodiments of the process, specific embodiments, specific examples, and combination of embodiments discussed above can be used in the process of forming the electronic device, so long as they are not mutually exclusive.

EXAMPLES

The concepts described herein will be further described in the following examples, which do not limit the scope of the invention described in the claims.

Synthesis Example 1

Aromatic amine polymer A2 can be prepared as follows.

(a) Synthesis of Compound 2

Under an atmosphere of nitrogen, a 250 mL round bottom was charged with 9,9-dioctyl-2,7-dibromofluorene (25.0 g, 45.58 mmol), phenylboronic acid (12.23 g, 100.28 mmol), Pd$_2$(dba)$_3$ (0.42 g, 0.46 mmol), P$^t$Bu$_3$ (0.22 g, 1.09 mmol) and 100 mL toluene. The reaction mixture stirred for five minutes after which KF (8.74 g, 150.43 mmol) was added in two portions and the resulting solution was stirred at room temperature overnight. The mixture was diluted with 500 mL THF and filtered through a plug of silica and celite and the volatiles were removed from the filtrate under reduced pressure. The yellow oil was purified by flash column chromatography on silica gel using hexanes as eluent. The product was obtained as a white solid in 80.0% (19.8 g). Analysis by NMR indicated the material to be compound 2 having structure given above.

(b) Synthesis of Compound 3

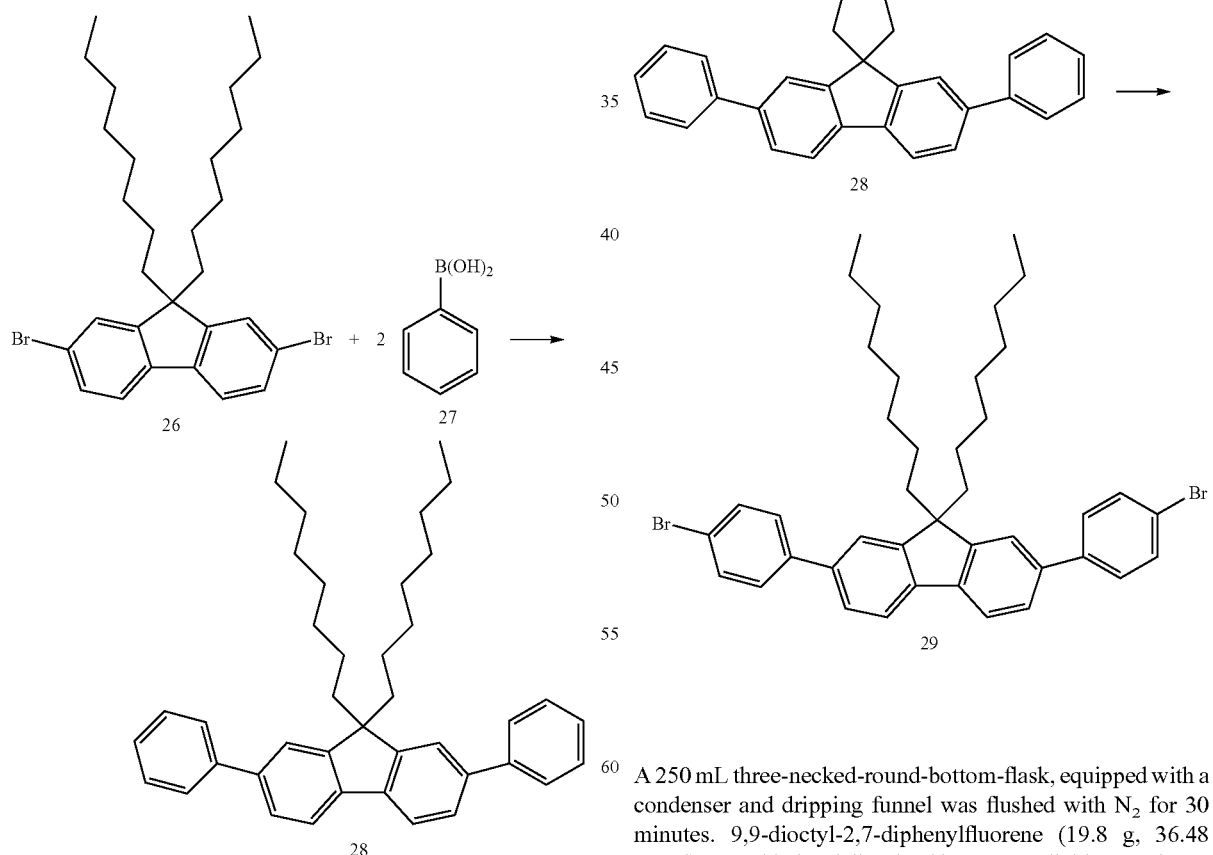

A 250 mL three-necked-round-bottom-flask, equipped with a condenser and dripping funnel was flushed with N$_2$ for 30 minutes. 9,9-dioctyl-2,7-diphenylfluorene (19.8 g, 36.48 mmol) was added and dissolved in 100 mL dichloromethane. The clear solution was cooled to −10° C. and a solution of bromine (12.24 g, 76.60 mmol) in 20 mL dichloromethane was added dropwise. The mixture was stirred for one hour at 0° C. and then allowed to warm to room temperature and stirred overnight. 100 mL of an aqueous 10% Na₂S₂O₃ solution was added and the reaction mixture was stirred for one hour. The organic layer was extracted and the water layer was washed three times with 100 mL dichloromethane. The combined organic layers were dried with Na₂SO₄ filtered and concentrated to dryness. Addition of acetone to the resulting oil gave a white precipitated. Upon filtration and drying a white powder was obtained (13.3 g, 52.2%). Analysis by NMR indicated the material to be compound 3 having structure given above.

(c) Synthesis of Compound 4

(10)

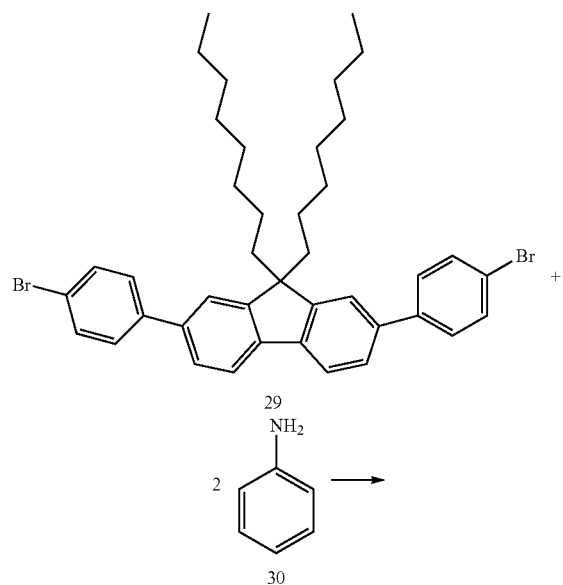

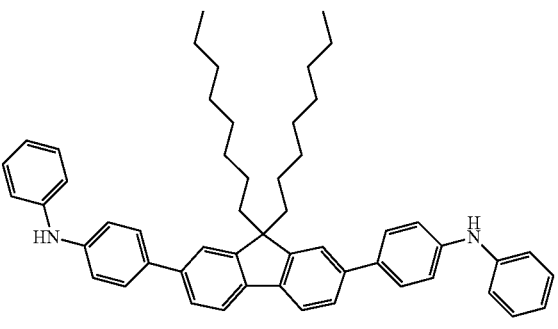

Under an atmosphere of nitrogen, a 250 mL round bottom was charged with 3 (13.1 g, 18.70 mmol), aniline (3.66 g, 39.27 mmol), Pd₂(dba)₃ (0.34 g, 0.37 mmol), P$^t$Bu₃ (0.15 g, 0.75 mmol) and 100 mL toluene. The reaction mixture stirred for 10 min after which NaO$^t$Bu (3.68 g, 38.33 mmol) was added and the reaction mixture was stirred at room temperature for one day. The resulting reaction mixture was diluted with 3 L toluene and filtered through a plug of silica and celite. Upon evaporation of volatiles, the dark brown oil obtained was purified by flash column chromatography on silica gel using a mixture of 1:10 ethyl acetate:hexanes as eluent. The product was obtained as a pale yellow powder in 50.2% (6.8 g). Analysis by NMR indicated the material to be compound 4 having structure given above.

(d) Synthesis of Compound 5

(11)

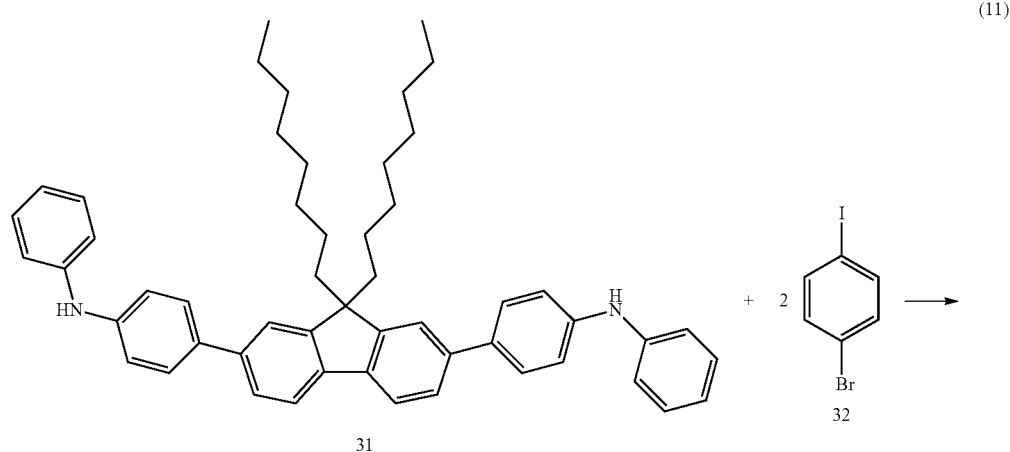

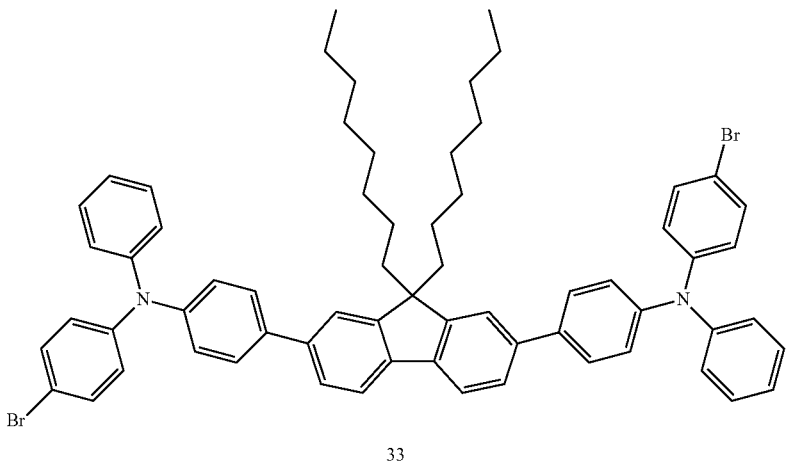

33

In a 250 mL three-necked-round-bottom-flask equipped with condenser, 4 (4.00 g, 5.52 mmol), 1-bromo-4-iodobenzene (4.68 g, 16.55 mmol), Pd$_2$(dba)$_3$ (0.30 g, 0.33 mmol) and DPPF (0.37 g, 0.66 mmol) were combined with 80 mL toluene. The resultant mixture was stirred for 10 min. NaO$^t$Bu (1.17 g, 12.14 mmol) was added and the mixture was heated to 80° C. for four days. The resulting reaction mixture was diluted with 1 L toluene and 1 L THF filtered through a plug of silica and celite to remove the insoluble salts. Upon evaporation of volatiles, the resulting brown oil was purified by flash column chromatography on silica gel using a mixture of 1:10 dichloromethane:hexanes as eluent. After drying a yellow powder was obtained (4.8 g, 84.8%). Analysis by NMR indicated the material to be compound 5 having structure given above.

(e) Polymerization

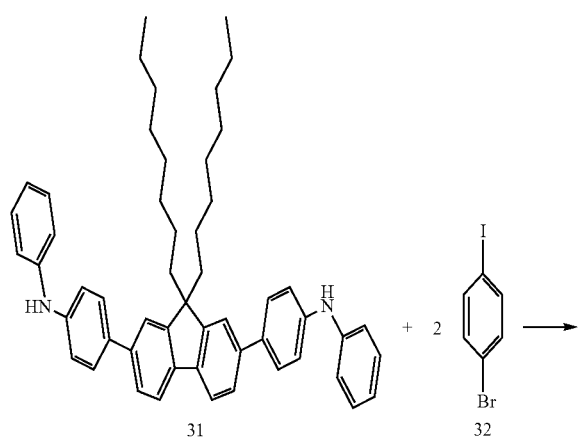

(11)

31

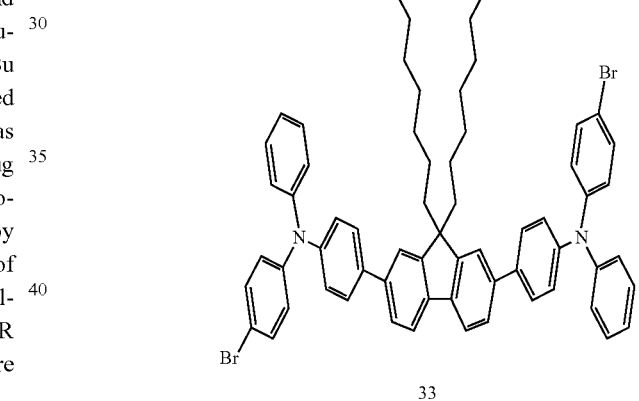

33

Bis(1,5-Cyclooctadiene)-nickel-(0) (0.833 g, 3.03 mmol) was added to a N,N-dimethylformamide (anhydrous, 6 mL) solution 2,2'-bipyridyl (0.473 g, 3.03 mmol) and 1,5-cyclooctadiene (0.328 g, 3.03 mmol). The resulting mixture was heated to 60 C for 30 min. A toluene (anhydrous, 24 mL) solution compound 5 (1.553 g, 1.50 mmol), was then added rapidly to the stirring catalyst mixture. The mixture was stirred at 60 C for seven hours. After the reaction mixture cooled to room temperature, it was poured, slowly, with vigorous stirring into 250 mL methanol and stirred overnight. Addition of 15 mL of conc. HCl followed and stirring for an hour. The precipitate was filtered and then added to 50 mL of toluene and poured slowly into 500 mL of methanol. The resulting light-yellow precipitate was stirred for one hour and then isolated by filtration. The solid was further purified by chromatography (silica, toluene) and precipitation from ethyl acetate. After drying the resulting material under vacuum a light yellow polymer was isolated in 82% yield (1.08 g). GPC (THF, room temperature): Mn=148,427; Mw=477,886; Mw/Mn=3.25. The materials was confirmed as aromatic amine polymer A2.

Additional materials include:

HIJ-1, which is an electrically conductive polymer doped with a polymeric fluorinated sulfonic acid. Such materials have been described in, for example, published U.S. patent applications US 2004/0102577, US 2004/0127637, US 2005/0205860, and published PCT application WO 2009/018009.

Ph-1, which is the photoinitiator triphenylsulfonium trifluoromethanesulfone (CAS 66003-78-9), which was purchased from Midori-Kagaku.

Ph-2, which is the photoinitiator triphenylsulfonium nonfluorobutanesulfonate (CAS 144317-44-2), which was purchased from Midori-Kagaku.

Ph-3, which is the photoinitiator bis(4-tert-butylphenyl) iodonium nonfluorobutanesulfonate (CAS 194999-85-4), which was purchased from Midori-Kagaku.

Ph-4, which is the photoinitiator shown below, which was purchased from BASF.

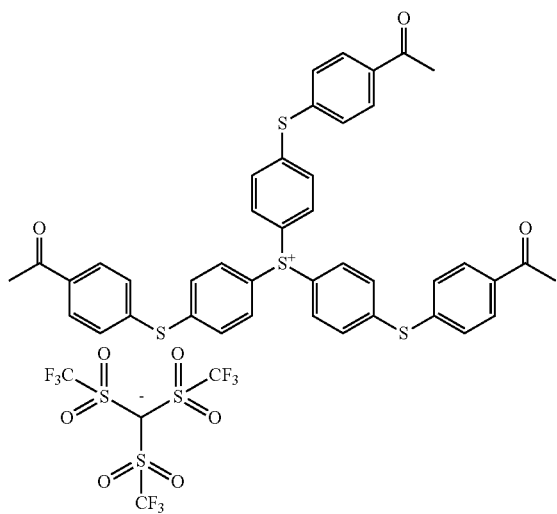

D-1, which is a diarylamino chrysene compound having blue emission. Such materials have been described in, for example, published PCT application WO2010035364.

host-1, which is a deuterated diarylanthracene host compound. Such materials have been described in, for example, published PCT application WO2010099534.

ET-1, which is a quinolate compound.

Examples 1-5

These examples illustrate the change in contact angle, when Process I is used.

The first layer is HIJ-1 containing a photoinitiator. A priming layer is formed by liquid deposition over the first layer, exposed, and developed by treatment with a liquid. The priming material consisted of aromatic amine A2. The photoinitiator, the amount, and the level of exposure was varied.

Test coupons were prepared by spin-coating an aqueous dispersion of HIJ-1 (5.65% solids) containing a photoinitiator onto a glass substrate to a thickness of 50 nm. This layer was dried by baking at 140° C. for 7 minutes. A priming layer was formed by spin coating a toluene solution of the priming material A2 onto the dried HIJ-1 layer, to form a 20 nm layer. The dried layer was exposed through a mask to 365 nm radiation with the dosage indicated below. After exposure, the priming layer was developed by spraying with anisole, and then dried with nitrogen. A drop of methyl benzoate was dispensed onto the surface and the contact angle measured using a goniometer (Krüss DSA-10). A summary of the materials, exposures and results is given in Table 1. In the table, "exposed" refers to the areas of the priming layer in the areas exposed to radiation after development, and "unexposed" refers to the unexposed areas after development.

TABLE 1

Test Coupon Results

| Ex. | Photo-initiator | Level (% w/v) | Exposure (mJ/cm$^2$) | Contact Angle with Methyl Benzoate | |
|---|---|---|---|---|---|
| | | | | Exposed | Unexposed |
| 1 | Ph-1 | 1.0 | 50 | <6° | 52° |
| 2 | Ph-1 | 0.5 | 50 | 24° | 53° |
| 3 | Ph-1 | 0.25 | 50 | 35° | 51° |
| 4 | Ph-2 | 1.0 | 50 | 20° | 51° |
| 5 | Ph-2 | 1.0 | 200 | 18° | 50° |
| 6 | Ph-3 | 1.0 | 50 | 25° | 50° |
| 7 | Ph-3 | 1.0 | 200 | 14° | 48° |
| 8 | Ph-4 | 1.0 | 50 | 30° | 53° |
| 9 | Ph-4 | 1.0 | 200 | 27° | 52° |

Level is the level of photoinitiator in the HIJ-1 dispersion.

It can be seen from Table 1, that the exposed areas are much more wettable with the methyl benzoate. The difference in wettability between the exposed and unexposed areas can provide chemical containment.

Example 10

This example illustrates the change in contact angle when Process II is used.

A test coupon was prepared by spin-coating an aqueous dispersion of HIJ-1 (5.65 wt % solids) onto a glass substrate to a thickness of 50 nm. No photoinitiator was present in the HIJ-1 layer. The layer was dried by baking at 140° C. for 7 minutes. An intermediate layer was formed by spin-coating a cyclopentanone solution of Ph-6 (0.1 wt %) over the dried HIJ-1 layer. A toluene solution of polymer A2 (0.4 wt %) was spin coated over the intermediate layer. This was exposed to 100 mJ/cm$^2$ of 365 nm radiation. After exposure, the layer was developed by rinsing first with anisole and then with cyclopentanone. The contact angle for exposed and unexposed areas was measured as described above.

Exposed areas: contact angle<6°

Unexposed areas: contact angle=30°

The exposed areas are much more wettable than the unexposed areas.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A process for forming a contained second layer over a first layer, said process comprising:
    forming the first layer comprising a fluorinated material and a photoinitiator, said first layer having a first surface energy;
    treating the first layer with a priming layer consisting essentially of an aromatic amine compound;
    exposing the priming layer patternwise with activating radiation, resulting in exposed areas and unexposed areas;
    developing the priming layer to effectively remove the priming layer from the unexposed areas resulting in a first layer having a patterned priming layer thereon, wherein the patterned priming layer has a second surface energy that is higher than the first surface energy; and
    forming the second layer by liquid deposition on the patterned priming layer on the first layer.

2. A process for making an organic electronic device comprising a support having thereon an electrode, a first organic active layer, and a second organic active layer, said process comprising
    forming the first organic active layer over the electrode, said first organic active layer comprising a fluorinated material and a photoinitiator, and said first organic active layer having a first surface energy;
    treating the first organic active layer with a priming layer consisting essentially of an aromatic amine compound;
    exposing the priming layer patternwise with activating radiation, resulting in exposed areas and unexposed areas;
    developing the priming layer to effectively remove the priming layer from the unexposed areas resulting in a first layer having a patterned priming layer, wherein the patterned priming layer has a second surface energy that is higher than the first surface energy; and
    forming the second organic active layer by liquid deposition on the pattern of priming layer on the first organic active layer.

3. A process for forming a contained second layer over a first layer, said process comprising:
    forming the first layer comprising a fluorinated material, said first layer having a first surface energy;
    forming an intermediate layer on the first layer, said intermediate layer comprising a photoinitiator;
    forming a priming layer consisting essentially of an aromatic amine compound on the intermediate layer;
    exposing the priming layer patternwise with activating radiation, resulting in exposed areas and unexposed areas;
    developing the priming layer to effectively remove the priming layer and the intermediate layer from the unexposed areas, resulting in a first layer having thereon a patterned priming layer, wherein the patterned priming layer has a second surface energy that is higher than the first surface energy; and
    forming the second layer by liquid deposition on the patterned priming layer on the first layer.

4. A process for making an organic electronic device comprising a support having thereon an electrode, a first organic active layer, and a second organic active layer, said process comprising
    forming the first organic active layer over the electrode, said first organic active layer comprising a fluorinated material, and said first organic active layer having a first surface energy;
    forming an intermediate layer on the first organic active layer, said intermediate layer consisting essentially of a photoinitiator;
    forming a priming layer consisting essentially of an aromatic amine compound on the intermediate layer;
    exposing the priming layer patternwise with activating radiation, resulting in exposed areas and unexposed areas;
    developing the priming layer to effectively remove the priming layer and the intermediate layer from the unexposed areas, resulting in a first layer having a patterned priming layer, wherein the patterned priming layer has a second surface energy that is higher than the first surface energy; and
    forming the second organic active layer by liquid deposition on the pattern of priming layer on the first organic active layer.

5. The process of any one of claims 1-4, wherein the photoinitiator is a photoacid generator.

6. The process of any one of claims 1-4, wherein the photoinitiator is a free radical generator.

7. The process of any one of claims 1-4, wherein the photoinitiator is an onium salt.

* * * * *